(12) United States Patent
Jung et al.

(10) Patent No.: US 12,171,115 B2
(45) Date of Patent: Dec. 17, 2024

(54) DISPLAY DEVICE

(71) Applicant: Samsung Display Co., Ltd., Yongin-si (KR)

(72) Inventors: Yang-Ho Jung, Seoul (KR); Jungi Kim, Hwaseong-si (KR); Junho Sim, Hwaseong-si (KR); Jaehun Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 51 days.

(21) Appl. No.: 17/246,457

(22) Filed: Apr. 30, 2021

(65) Prior Publication Data

US 2022/0059802 A1  Feb. 24, 2022

(30) Foreign Application Priority Data

Aug. 21, 2020 (KR) .................. 10-2020-0105622

(51) Int. Cl.
| | | |
|---|---|---|
| *H01L 51/52* | (2006.01) | |
| *H10K 50/856* | (2023.01) | |
| *H10K 59/40* | (2023.01) | |
| *G06F 3/041* | (2006.01) | |
| *G06F 3/044* | (2006.01) | |
| *H10K 59/122* | (2023.01) | |

(52) U.S. Cl.
CPC .......... *H10K 50/856* (2023.02); *H10K 59/40* (2023.02); *G06F 3/04164* (2019.05); *G06F 3/0446* (2019.05); *G06F 2203/04112* (2013.01); *H10K 59/122* (2023.02)

(58) Field of Classification Search
CPC ................... H01L 51/5271; H01L 27/3246
See application file for complete search history.

(56) References Cited

U.S. PATENT DOCUMENTS

| | | | |
|---|---|---|---|
| 9,640,782 B2 | 5/2017 | Choi et al. | |
| 10,564,507 B2 | 2/2020 | Kang et al. | |
| 10,644,083 B2 | 5/2020 | Lee et al. | |
| 12,004,371 B2 | 6/2024 | Kim et al. | |
| 2011/0108877 A1* | 5/2011 | Yamada | H10K 71/50 |
| | | | 257/E33.059 |
| 2014/0159064 A1* | 6/2014 | Sakariya | H01L 25/167 |
| | | | 257/88 |

(Continued)

FOREIGN PATENT DOCUMENTS

| | | |
|---|---|---|
| KR | 10-1441388 B1 | 9/2014 |
| KR | 10-2015-0145834 A | 12/2015 |
| KR | 10-2018-0005327 A | 1/2018 |

(Continued)

*Primary Examiner* — Vu A Vu
*Assistant Examiner* — Valerie N Newton
(74) *Attorney, Agent, or Firm* — Lewis Roca Rothgerber Christie LLP

(57) ABSTRACT

A display device includes: a display element layer including an emission area and a non-emission area around the emission area; a first conductive layer on the non-emission area; a first insulating layer on the non-emission area to cover the first conductive layer, the first insulating layer having an opening part overlapping the emission area in a plan view; a second conductive layer on the first insulating layer; and a reflection pattern spaced apart from the second conductive layer and on the first insulating layer.

19 Claims, 16 Drawing Sheets

(56) References Cited

U.S. PATENT DOCUMENTS

2016/0020430 A1\* 1/2016 Kim ................. H10K 50/818
  257/40
2022/0077256 A1\* 3/2022 Lim .................. H01L 27/3246

FOREIGN PATENT DOCUMENTS

| KR | 10-2019-0016635 A | 2/2019 | | |
|---|---|---|---|---|
| KR | 10-2020-0044233 A | 4/2020 | | |
| KR | 10-2020-0085968 A | 7/2020 | | |
| WO | WO-2020145506 A1 \* | 7/2020 | ........... | G06F 3/0446 |

\* cited by examiner

DISPLAY DEVICE

CROSS-REFERENCE TO RELATED APPLICATION

The present application claims priority to and the benefit of Korean Patent Application No. 10-2020-0105622, filed on Aug. 21, 2020, the entire content of which are hereby incorporated by reference.

BACKGROUND

Aspects of some example embodiments of the present disclosure herein relate to a display device.

In general, electronic devices such as smart phones, digital cameras, notebook computers, navigation systems, and smart televisions, which provide images to users, include display devices for displaying images. The display device generates an image and provides the generated image to a user through a display screen.

The display device includes a display panel generating an image and an input sensing unit located on the display panel to detect an external input. The display panel includes an emission area generating light for displaying an image and a non-emission area around the emission area. The input sensing unit includes a plurality of sensing electrodes for detecting an external input. The sensing electrodes are located at the non-emission area.

Light generated in the emission area travels to the left and right sides of the display device as well as the front side of the display device. Accordingly, there is a demand for technology development for improving the front luminance by improving the amount of light traveling to the front of the display device.

The above information disclosed in this Background section is only for enhancement of understanding of the background and therefore the information discussed in this Background section does not necessarily constitute prior art.

SUMMARY

Aspects of some example embodiments of the present disclosure include a display device capable of improving front luminance.

Aspects of some example embodiments of the inventive concept include a display device including: a display element layer including an emission area and a non-emission area around the emission area; a first conductive layer located on the non-emission area; a first insulating layer located on the non-emission area to cover the first conductive layer and in which an opening part overlapping the emission area is defined when viewed from a plane; a second conductive layer located on the first insulating layer; and a reflection pattern spaced apart from the second conductive layer and located on the first insulating layer.

According to some example embodiments of the inventive concept, a display device includes: a display element layer including an emission area and a non-emission area around the emission area; a thin film sealing layer located on the display element layer; an insulating layer located on the thin film sealing layer; a first insulating layer located directly on the insulating layer and in which an opening part overlapping the display area is defined; and a reflection pattern located on a side surface of the first insulating layer.

BRIEF DESCRIPTION OF THE FIGURES

The accompanying drawings are included to provide a further understanding of embodiments according to the inventive concept, and are incorporated in and constitute a part of this specification. The drawings illustrate aspects of some example embodiments of the inventive concept and, together with the description, serve to explain principles of the inventive concept. In the drawings.

DETAILED DESCRIPTION

Figure 1:
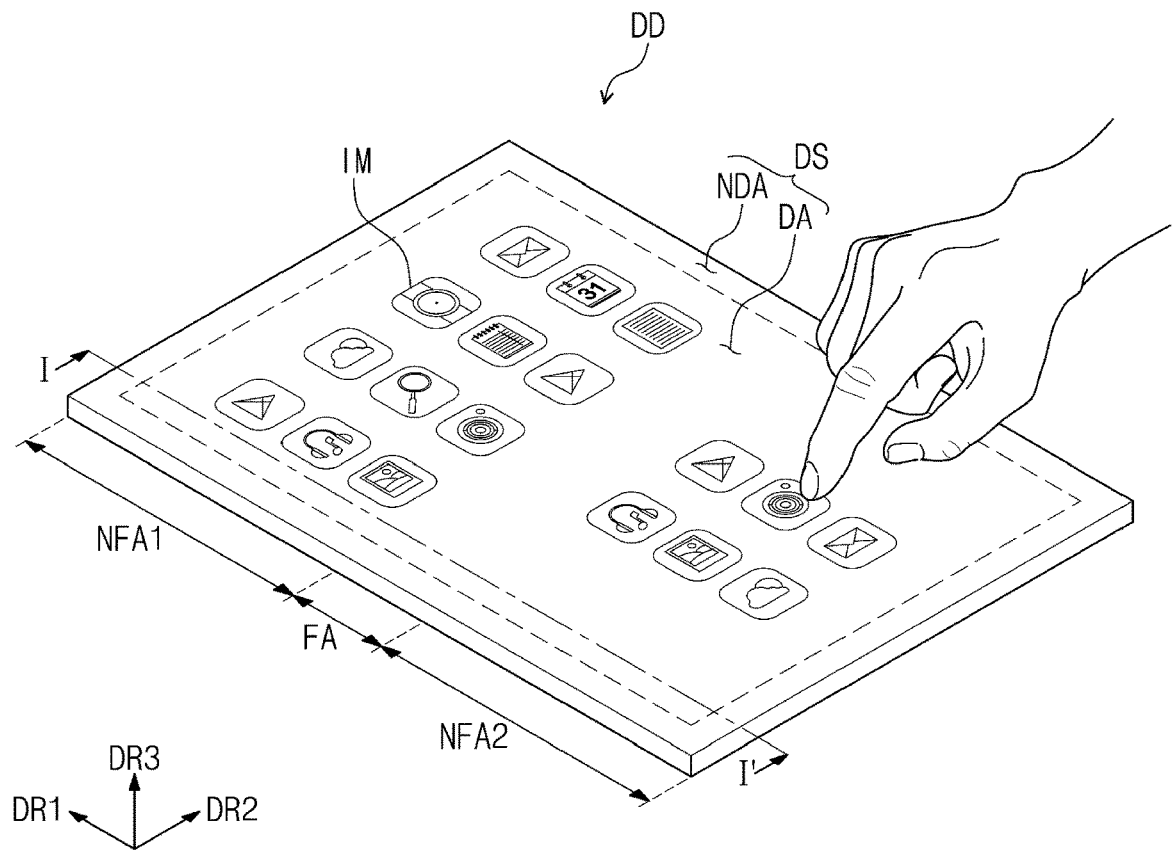
FIG. 1 is a perspective view of a display device according to some example embodiments of the inventive concept.

In this specification, when an element (or region, layer, part, etc.) is referred to as being "on", "connected to", or "coupled to" another element, it means that it can be directly placed on/connected to/coupled to other components, or a third component can be arranged between them.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as commonly understood by one of ordinary skill in the art to which this inventive concept belongs. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, aspects of some example embodiments of the inventive concept will be described in more detail with reference to the drawings.

Figure 2:
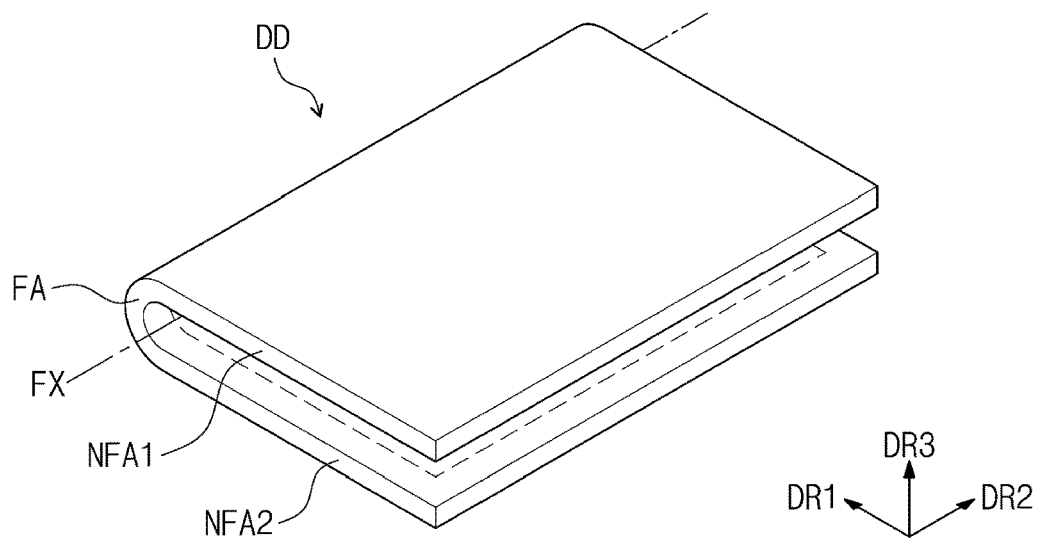
FIG. 2 is a diagram illustrating a folding state of the display device illustrated in FIG. 1.

FIG. 1 is a perspective view of a display device according to some example embodiments of the inventive concept. FIG. 2 is a diagram illustrating a folding state of the display device illustrated in FIG. 1.

Referring to FIG. 1, a display device DD according to some example embodiments of the inventive concept may have a rectangular shape with long sides extending in a first direction DR1 and short sides extending in a second direction DR2 intersecting the first direction DR1. However, embodiments according to the inventive concept are not limited thereto, and the display device DD may have various shapes such as a circle and a polygon. The display device DD may be a flexible display device.

Hereinafter, the direction substantially perpendicular to the plane defined by the first direction DR1 and the second direction DR2 is defined as a third direction DR3. In addition, in this specification, the meaning of "when viewed from the plane" or "in a plan view" may mean a perspective viewed from the third direction DR3, that is, a direction perpendicular or normal with respect to the plan defined by the first direction DR1 and the second direction DR2.

The display device DD may include a folding area FA and a plurality of non-folding areas NFA1 and NFA2. The non-folding areas NFA1 and NFA2 may include a first non-folding area NFA1 and a second non-folding area NFA2. The folding area FA may be located between the first non-folding area NFA1 and the second non-folding area NFA2. The folding area FA, the first non-folding area NFA1, and the second non-folding area NFA2 may be arranged in the first direction DR1.

For example, one folding area FA and the two non-folding areas NFA1 and NFA2 are illustrated, but the number of folding area FA and non-folding areas NFA1 and NFA2 is not limited thereto. For example, the display device DD may include more than two non-folding areas and a plurality of folding areas located between the non-folding areas.

The upper surface of the display device DD may be defined as the display surface DS and may have a plane defined by the first direction DR1 and the second direction DR2. The images IM generated by the display device DD may be provided to the user through the display surface DS.

The display surface DS may include a display area DA and a non-display area NDA around the display area DA. The display area DA may display images (or may be configured to display images), and the non-display area NDA may not display images (or may not be configured to display images, e.g., a bezel area). The non-display area NDA may surround the display area DA and may define an outline portion of the display device DD printed in a color (e.g., a set or predetermined color).

Referring to FIG. 2, the display device DD may be a foldable display device DD that is folded or unfolded. For example, the folding area FA may be configured to be bent based on the folding axis FX parallel to the second direction DR2, so that the display device DD may be folded. The folding axis FX may be defined as a short axis parallel to the short side of the display device DD.

When the display device DD is folded, the first non-folding area NFA1 and the second non-folding areas NFA2 face each other, and the display device DD may be in-folded to prevent the display surface DS from being exposed to the outside.

Figure 3:
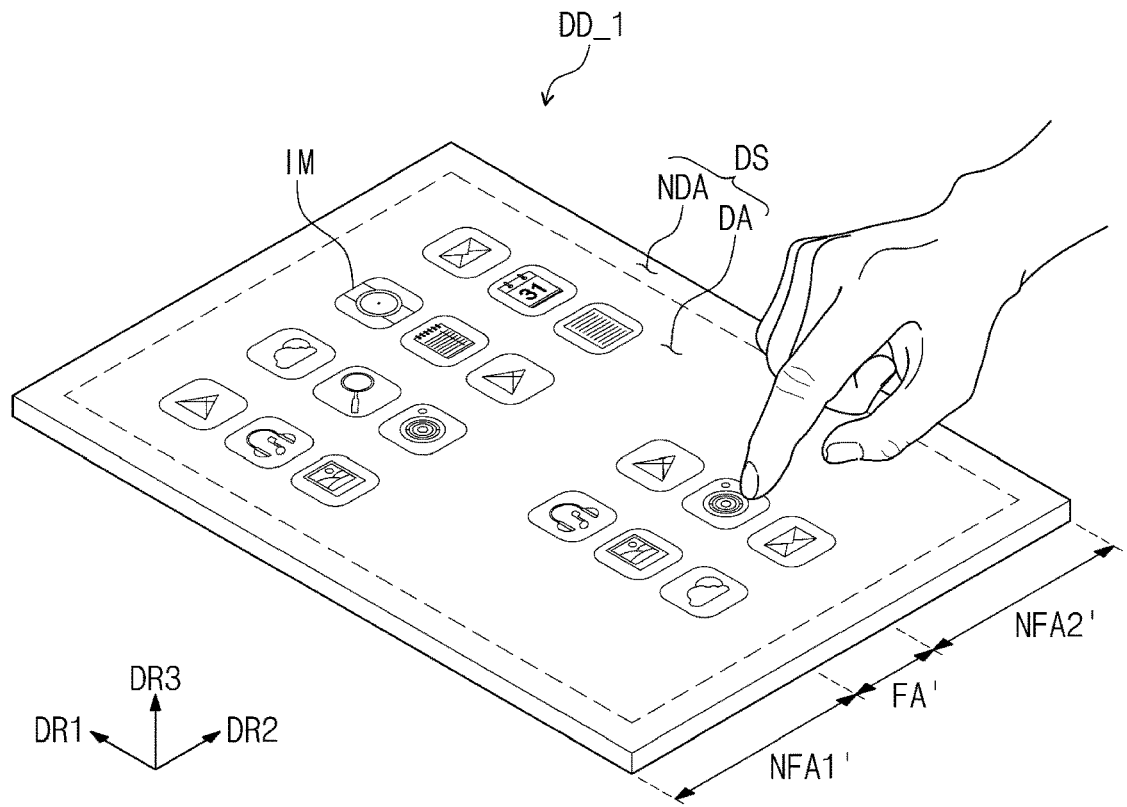
FIG. 3 is a perspective view of a display device according to some example embodiments of the inventive concept.
Figure 4:
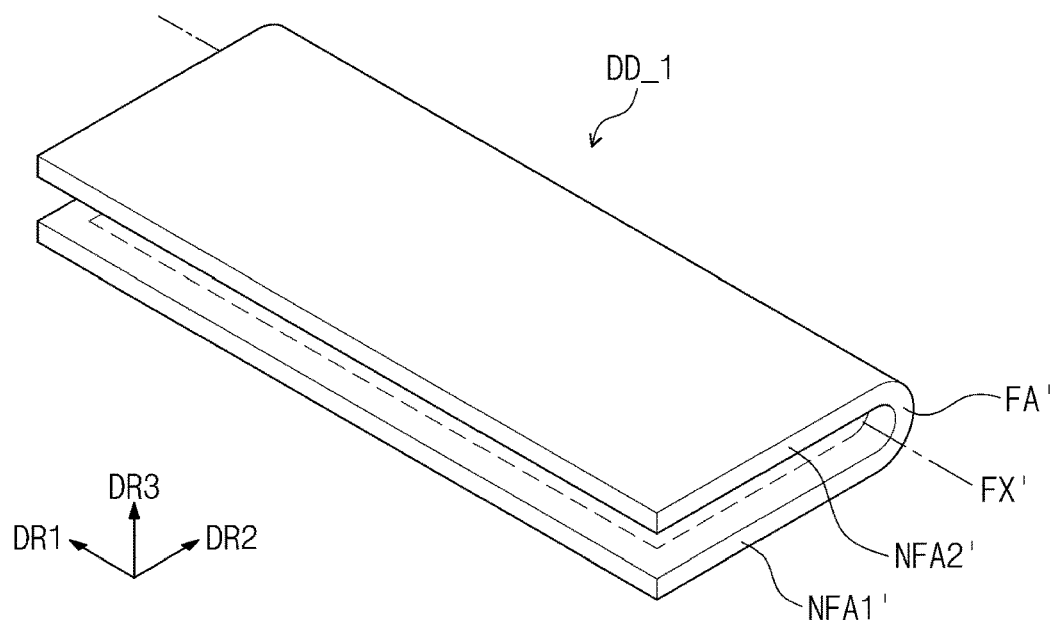
FIG. 4 is a diagram illustrating a folding state of the display device illustrated in FIG. 3 according to some example embodiments.

FIG. 3 is a perspective view of a display device according to some example embodiments of the inventive concept. FIG. 4 is a diagram illustrating a folding state of the display device illustrated in FIG. 3.

Except for the folding operation, a display device DD_1 illustrated in FIG. 3 may have substantially the same configuration as the display device DD illustrated in FIG. 1. Accordingly, the folding operation of the display device DD_1 will be mainly described below.

Referring to FIGS. 3 and 4, the display device DD_1 may include a folding area FA' and a plurality of non-folding areas NFA1' and NFA2'. The non-folding areas NFA1' and NFA2' may include a first non-folding area NFA1' and a second non-folding area NFA2'. The folding area FA' may be located between the first non-folding area NFA1' and the second non-folding area NFA2'. The folding area FA', the first non-folding area NFA1', and the second non-folding area NFA2' may be arranged in the second direction DR2.

The folding area FA' is bent based on the folding axis FX' parallel to the first direction DR1, so that the display device DD_1 may be folded. The folding axis FX' may be defined as a long axis parallel to the long side of the display device DD_1. The display device DD illustrated in FIG. 1 may be folded based on a short axis, and unlike this, the display device DD_1 illustrated in FIG. 3 may be folded based on a long axis. The display device DD_1 may be in-folded so that the display surface DS is not exposed to the outside.

Figure 5:
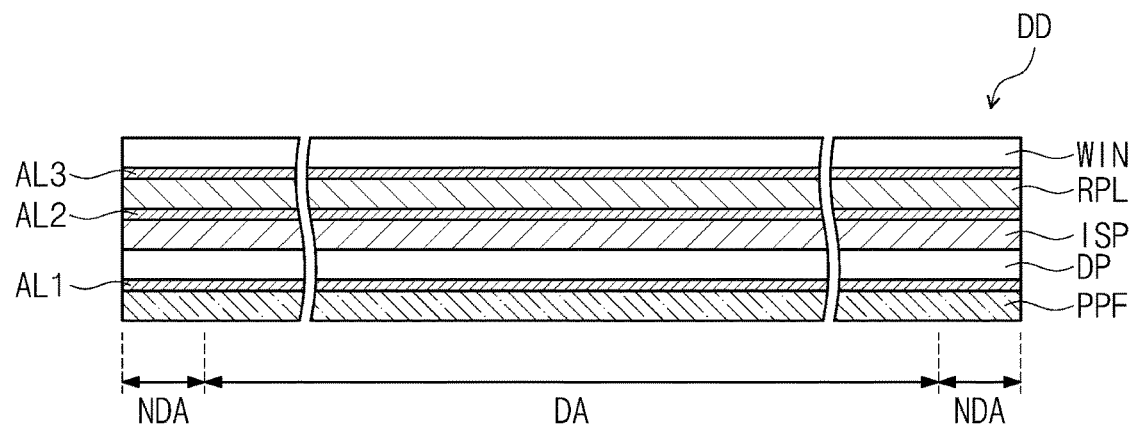
FIG. 5 is a cross-sectional diagram of the display device shown in FIG. 1 according to some example embodiments.
Figure 5:
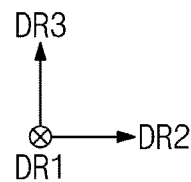

FIG. 5 is a diagram illustrating a cross-section of the display device shown in FIG. 1 by way of example.

For example, in FIG. 5, a cross-section of the display device DD viewed from the first direction DR1 is illustrated.

Referring to FIG. 5, the display device DD may include a display panel DP, an input sensing unit ISP, an antireflection layer RPL, a window WIN, a panel protection film PPF, and first to third adhesive layers AL1 to AL3.

The display panel DP may be a flexible display panel. The display panel DP according to some example embodiments of the inventive concept may be a light emitting display panel, but embodiments according to the present disclosure are not particularly limited. For example, the display panel DP may be an organic light emitting display panel or a quantum dot light emitting display panel. In the organic light emitting display panel, the light emitting layer may include an organic light emitting material. The light emitting layer of the quantum dot light emitting display panel may include quantum dot, quantum rod, and the like. Hereinafter, the display panel DP is described as the organic light emitting display panel.

The input sensing unit ISP may be located on the display panel DP. The input sensing unit ISP may include a plurality of sensor units for detecting an external input in a capacitive method. The input sensing unit ISP may be directly manufactured on the display panel DP when the display device DD is manufactured. However, embodiments according to the inventive concept are not limited thereto, and the input sensing unit ISP may be manufactured as a panel separated from the display panel DP and then, attached to the display panel DP by an adhesive.

The antireflection layer RPL may be located on the input sensing unit ISP. The antireflection layer RPL may reduce reflectance of external light incident on the display panel DP from above the display device DD. For example, the antireflection layer RPL may include a phase retarder and/or a polarizer.

The window WIN may be located on the antireflection layer RPL. The window WIN may protect the display panel DP, the input sensing unit ISP, and the antireflection layer RPL from external scratches and impacts.

The panel protection film PPF may be located under the display panel DP. The panel protection film PPF may protect the lower part of the display panel DP. The panel protection film PPF may include a flexible plastic material such as polyethylene terephthalate (PET).

The first adhesive layer AL1 may be located between the display panel DP and the panel protection film PPF. The display panel DP and the panel protection film PPF may be adhered to each other by the first adhesive layer AL1.

The second adhesive layer AL2 may be located between the antireflection layer RPL and the input sensing unit ISP. The antireflection layer RPL and the input sensing unit ISP may be adhered to each other by the second adhesive layer AL2.

The third adhesive layer AL3 may be located between the window WIN and the antireflection layer RPL. The window WIN and the antireflection layer RPL may be adhered to each other by the third adhesive layer AL3.

Figure 6:
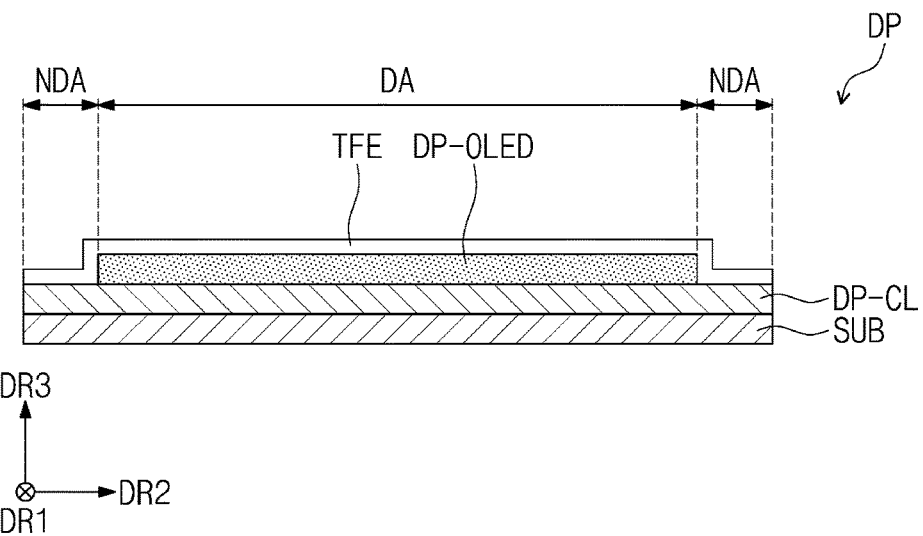
FIG. 6 is a cross-sectional diagram of the display panel shown in FIG. 5 according to some example embodiments.

FIG. 6 is a diagram illustrating a cross-section of the display panel shown in FIG. 5 by way of example.

For example, in FIG. 6, a cross-section of the display panel DP viewed from the first direction DR1 is illustrated.

Referring to FIG. 6, the display panel DP may include a substrate SUB, a circuit element layer DP-CL located on the substrate SUB, a display element layer DP-OLED located on the circuit element layer DP-CL, and a thin film sealing layer TFE located on the display element layer DP-OLED.

The substrate SUB may include a display area DA and a non-display area NDA around the display area DA. The substrate SUB may include a flexible plastic material such as polyimide (PI). The display element layer DP-OLED may be located on the display area DA.

A plurality of pixels may be located on the circuit element layer DP-CL and the display element layer DP-OLED. Each of the pixels may include a transistor located on the circuit element layer DP-CL and a light emitting element located on the display element layer DP-OLED and connected to the transistor. The configuration of the pixel will be described in more detail below.

The thin film sealing layer TFE may be located on the circuit element layer DP-CL to cover the display element layer DP-OLED. The thin film sealing layer TFE may include inorganic layers and an organic layer between the inorganic layers. The inorganic layers can protect the pixels from moisture/oxygen. The organic layer may protect the pixels PX from foreign substances such as dust particles.

Figure 7:
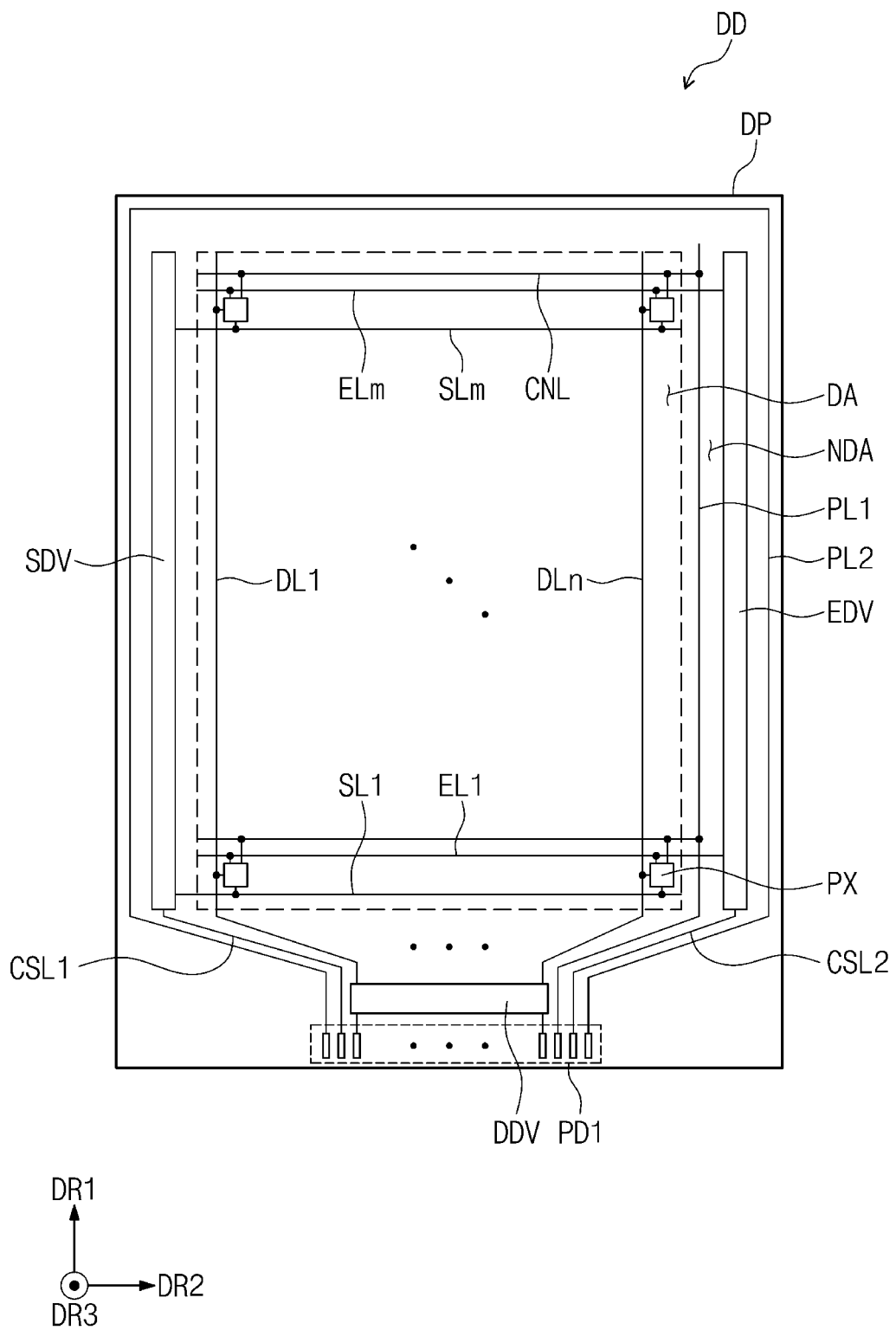
FIG. 7 is a plan view of the display panel illustrated in FIG. 5 according to some example embodiments.

FIG. 7 is a plan view of the display panel illustrated in FIG. 5.

Referring to FIG. 7, the display device DD includes a display panel DP, a scan driver SDV, a data driver DDV, an emission driver EDV, and a plurality of first pads PD1.

The display panel DP may have a rectangular shape having long sides extending in the first direction DR1 and short sides extending in the second direction DR2, but the shape of the display panel DP is not limited thereto. The display panel DP may include a display area DA and a non-display area NDA surrounding the display area DA.

The display panel DP may include a plurality of pixels PX, a plurality of scan lines SL1 to SLm, a plurality of data lines DL1 to DLn, a plurality of light emitting lines EL1 to ELm, first and second control lines CSL1 and CSL2, first and second power lines PL1 and PL2, and connection lines CNL. m and n are natural numbers.

The pixels PX may be located in the display area DA. The scan driver SDV and the emission driver EDV may be located in the non-display area NDA adjacent to the long sides of the display panel DP, respectively. The data driver DDV may be located in the non-display area NDA adjacent to one of the short sides of the display panel DP. When viewed from the plane, the data driver DDV may be adjacent to the lower end of the display panel DP.

The scan lines SL1 to SLm may extend in the second direction DR2 and may be connected to the pixels PX and the scan driver SDV. The data lines DL1 to DLn may extend in the first direction DR1 to be connected to the pixels PX and the data driver DDV. The emission lines EL1 to ELm extend in the second direction DR2 and may be connected to the pixels PX and the emission driver EDV.

The first power line PL1 may extend in the first direction DR1 and may be located in the non-display area NDA. The first power line PL1 may be located between the display area DA and the emission driver EDV, but embodiments according to the present disclosure are not limited thereto, and according to some example embodiments the first power line PL1 may be located between the display area DA and the scan driver SDV.

The connection lines CNL may extend in the second direction DR2 and may be arranged in the first direction DR1. The connection lines CNL may be connected to the first power line PL1 and the pixels PX. The first voltage may be applied to the pixels PX through the first power line PL1 connected to each other and the connection lines CNL.

The second power line PL2 may be located in the non-display area NDA. The second power line PL2 may extend along long sides of the display panel DP and along the other short side of the display panel DP on which the data driver DDV is not located. The second power line PL2 may be located outside the scan driver SDV and the emission driver EDV.

According to some example embodiments, the second power line PL2 may extend toward the display area DA to be connected to the pixels PX. A second voltage having a level lower than the first voltage may be applied to the pixels PX through the second power line PL2.

The first control line CSL1 may be connected to the scan driver SDV and may extend toward the lower end of the display panel DP when viewed from the plane. The second control line CSL2 may be connected to the emission driver EDV and may extend toward the lower end of the display panel DP when viewed from the plane. The data driver DDV may be located between the first control line CSL1 and the second control line CSL2.

The first pads PD1 may be located on the display panel DP. The first pads PD1 may be closer to the lower end of the display panel DP than the data driver DDV. The data driver DDV, the first power line PL1, the second power line PL2, the first control line CSL1, and the second control line CSL2 may be connected to the first pads PD1. The data lines DL1 to DLn may be connected to the data driver DDV, and the data driver DDV may be connected to the first pads PD1 corresponding to the data lines DL1 to DLn.

According to some example embodiments, the display device DD may include a timing controller for controlling operations of the scan driver SDV, the data driver DDV, and the emission driver EDV, and a voltage generation unit for generating first and second voltages. The timing controller and the voltage generation unit may be connected to the corresponding first pads PD1 through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may be provided with the data voltages in response to the scan signals. The pixels PX may display an image by emitting light having luminance corresponding to data voltages in response to emission signals. The emission time of the pixels PX may be controlled by emission signals.

Figure 8:
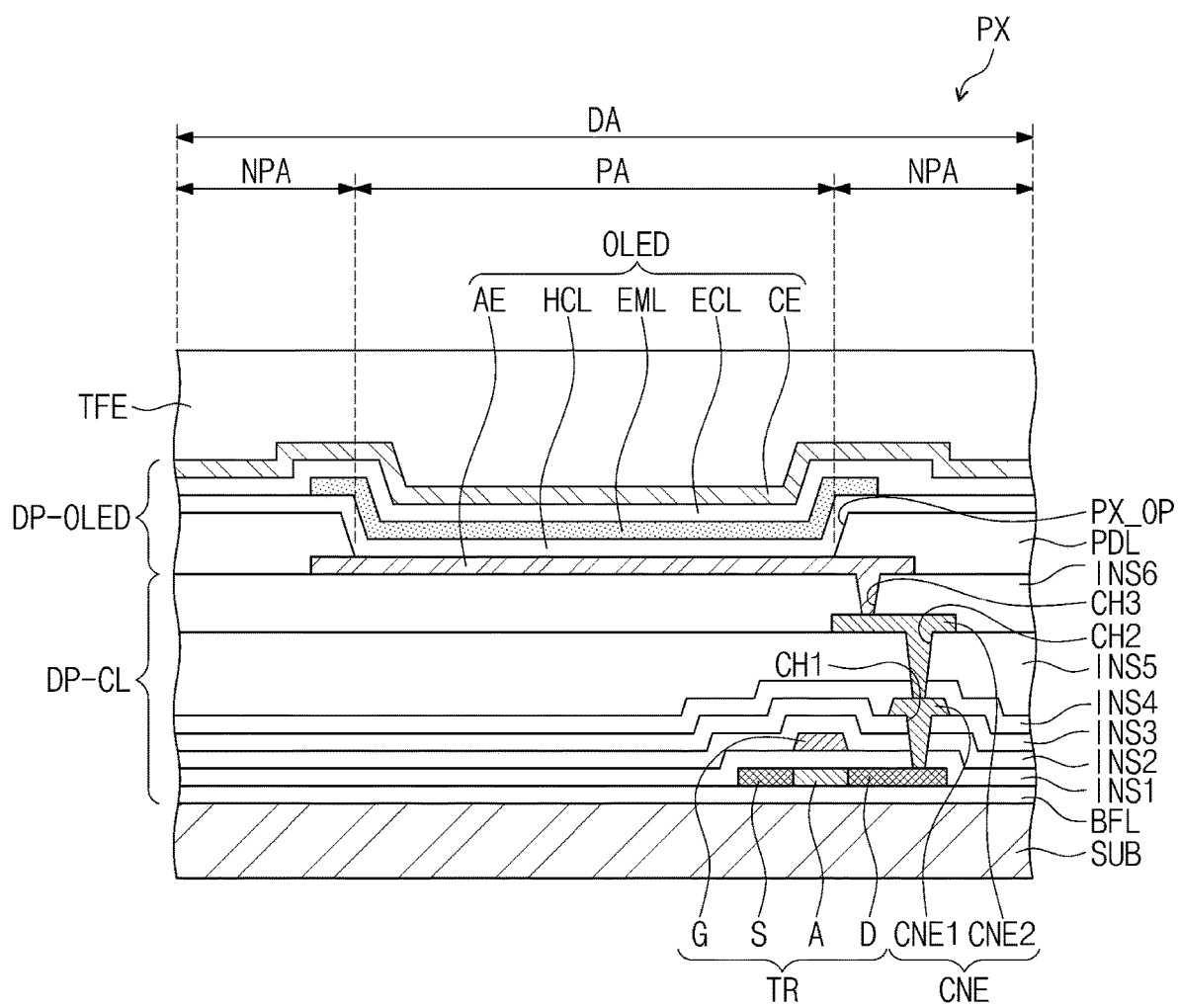
FIG. 8 is an example cross-sectional diagram of one pixel illustrated in FIG. 7 according to some example embodiments.

FIG. 8 is a diagram illustrating a cross section of one pixel illustrated in FIG. 7 by way of example.

Referring to FIG. 8, the pixel PX is located on the substrate SUB, and may include a transistor TR and a light emitting element OLED. The light emitting element OLED may include a first electrode AE, a second electrode CE, a hole control layer HCL, an electronic control layer ECL, and an emission layer EML. The first electrode AE may be an anode electrode, and the second electrode CE may be a cathode electrode.

The transistor TR and the light emitting element OLED may be located on the substrate SUB. For example, one transistor TR is illustrated, but substantially, the pixel PX may include a plurality of transistors and at least one capacitor for driving the light emitting element OLED.

The display area DA may include an emission area PA corresponding to the pixel PX and a non-emission area NPA around the emission area PA. The light emitting element OLED may be located in the emission area PA.

The substrate SUB may include a flexible plastic substrate. For example, the substrate SUB may include transparent polyimide (PI). A buffer layer BFL may be located on the substrate SUB, and may be an inorganic layer. A semiconductor pattern may be located on the buffer layer BFL. The semiconductor pattern may include polysilicon. However, embodiments according to the inventive concept are not limited thereto, and the semiconductor pattern may include amorphous silicon or metal oxide.

The semiconductor pattern may be doped with an N-type dopant or a P-type dopant. The electrical properties of the semiconductor pattern may vary depending on whether it is doped. The semiconductor pattern may include a high doping area and a low doping area. The conductivity of the high doping area is greater than that of the low doping area, and may substantially serve as a source electrode and a drain electrode of the transistor TR. The low doping area may substantially correspond to the active (or channel) of the transistor.

The source S, active A, and drain D of the transistor TR may be formed from a semiconductor pattern. The first insulating layer INS1 may be located on the semiconductor pattern. A gate G of the transistor TR may be located on the first insulating layer INS1. A second insulating layer INS2 may be located on the gate G. A third insulating layer INS3 may be located on the second insulating layer INS2.

The connection electrode CNE is located between the transistor TR and the light emitting element OLED to connect the transistor TR and the light emitting element OLED. The connection electrode CNE may include a first connection electrode CNE1 and a second connection electrode CNE2.

The first connection electrode CNE1 may be located on the third insulating layer INS3, and may be connected to the drain D through the first contact hole CH1 defined in the first to third insulating layers INS1 to INS3. A fourth insulating layer INS4 may be located on the first connection electrode CNE1. A fifth insulating layer INS5 may be located on the fourth insulating layer INS4.

The second connection electrode CNE2 may be located on the fifth insulating layer INS5. The second connection electrode CNE2 may be connected to the first connection electrode CNE1 through the second contact hole CH2 defined in the fifth insulating layer INS5. A sixth insulating layer INS6 may be located on the second connection electrode CNE2. The first to sixth insulating layers INS1 to INS6 may be inorganic or organic layers.

The first electrode AE may be located on the sixth insulating layer INS6. The first electrode AE may be connected to the second connection electrode CNE2 through the third contact hole CH3 defined in the sixth insulating layer INS6. A pixel defining layer PDL exposing a portion (e.g., a set or predetermined portion) of the first electrode AE may be located on the first electrode AE and the sixth insulating layer INS6. An opening part PX_OP for exposing a portion (e.g., a set or predetermined portion) of the first electrode AE may be defined in the pixel defining layer PDL.

The hole control layer HCL may be located on the first electrode AE and the pixel defining layer PDL. The hole control layer HCL may be commonly located in the emission area PA and the non-emission area NPA. The hole control layer HCL may include a hole transport layer and a hole injection layer.

The emission layer EML may be located on the hole control layer HCL. The emission layer EML may be located in an area corresponding to the opening part PX_OP. The emission layer EML may include an organic material and/or an inorganic material. The emission layer EML may generate any one of red, green, and blue light.

The electron control layer ECL may be located on the emission layer EML and the hole control layer HCL. The electron control layer ECL may be commonly located in the emission area PA and the non-emission area NPA. The electron control layer ECL may include an electron transport layer and an electron injection layer.

The second electrode CE may be located on the electronic control layer ECL. The second electrode CE may be commonly located or formed on the pixels PX. A layer from the buffer layer BFL to the light emitting element OLED may be defined as a pixel layer PXL.

The thin film sealing layer TFE may be located on the light emitting element OLED. The thin film sealing layer TFE may be located on the second electrode CE to cover the pixel PX.

A first voltage may be applied to the first electrode AE through the transistor TR, and a second voltage having a level lower than the first voltage may be applied to the second electrode CE. The holes and electrons injected into the emission layer EML are combined to form excitons, and as the excitons transition to the ground state, the light emitting element OLED may emit light.

Figure 9:
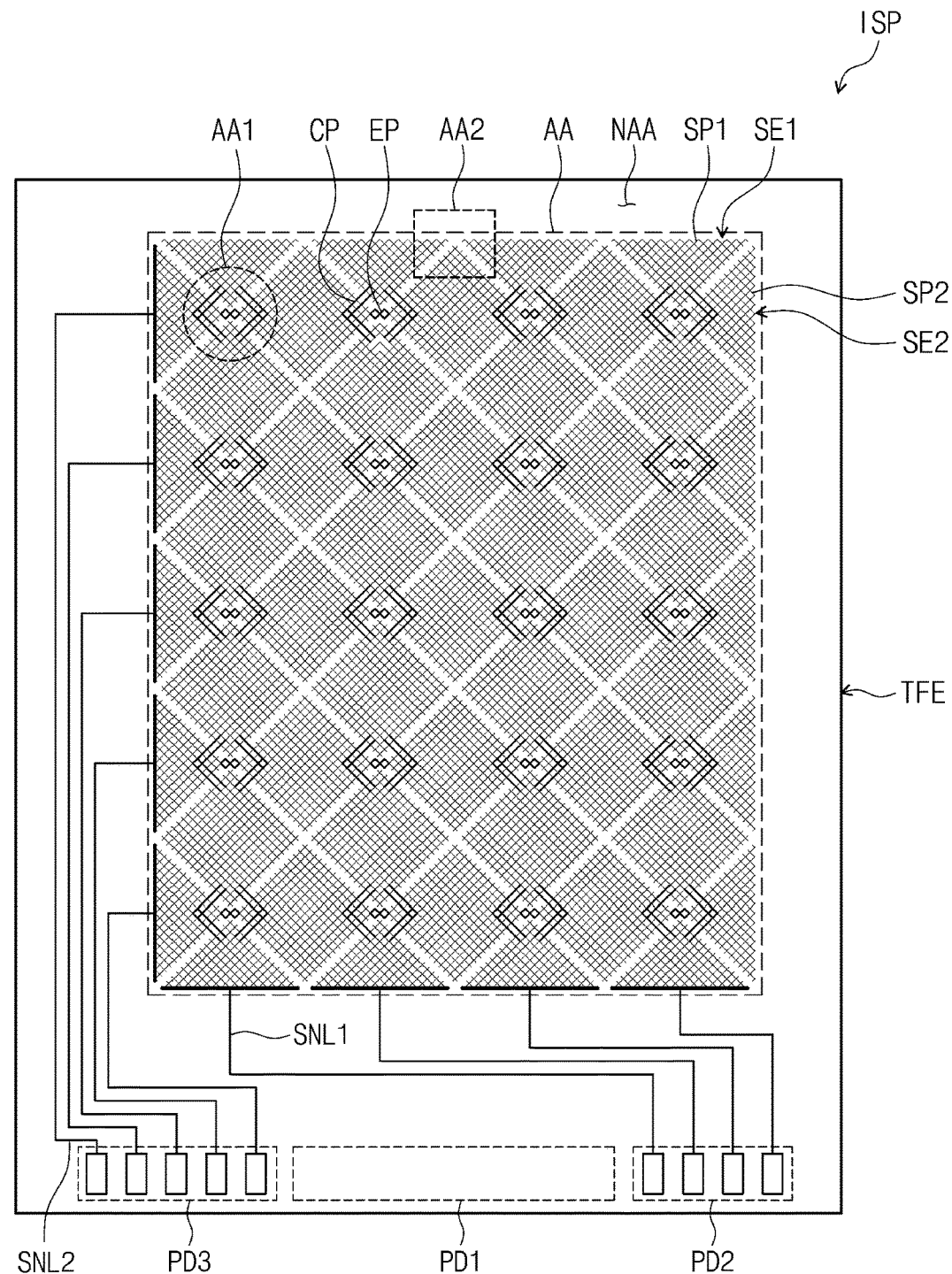
FIG. 9 is a plan view of the input sensing unit shown in FIG. 5 according to some example embodiments.

FIG. 9 is a plan view of the input sensing unit shown in FIG. 5.

Referring to FIG. 9, the input sensing unit ISP may include a plurality of sensing electrodes SE1 and SE2, a plurality of wires SNL1 and SNL2, and a plurality of second and third pads PD2 and PD3. The sensing electrodes SE1 and SE2, the wires SNL1 and SNL2, and the second and third pads PD2 and PD3 may be located on the thin film sealing layer TFE.

The planar area of the input sensing unit ISP may include an active area AA and an inactive area NAA around the active area AA. The active area AA may overlap the display area DA, and the inactive area NAA may overlap the non-display area NDA. The sensing electrodes SE1 and SE2 may be located in the active area AA, and the second and third pads PD2 and PD3 may be located in the inactive area NAA. When viewed from a plane, the first pads PD1 may include second pads PD2 and third pads PD3.

The wires SNL1 and SNL2 may be connected to one ends of the sensing electrodes SE1 and SE2, and may extend to the inactive area NAA to be connected to the second and third pads PD2 and PD3. The second and third pads PD2 and PD3 may be connected to the above-described printed circuit board PCB. According to some example embodiments, the sensing control unit for controlling the input sensing unit may be connected to the second and third pads PD2 and PD3 through the printed circuit board PCB.

The sensing electrodes SE1 and SE2 may include a plurality of first sensing electrodes SE1 extending in the first direction DR1 and arranged in the second direction DR2, and a plurality of second sensing electrodes SE2 extending in the second direction DR2 and arranged in the first direction DR1. The second sensing electrodes SE2 may be insulated from and extended to cross the first sensing electrodes SE1.

The wires SNL1 and SNL2 may include a plurality of first signal wires SNL1 connected to the first sensing electrodes SE1 and a plurality of second signal wires SNL2 connected to the second sensing electrodes SE2. The first signal wires SNL1 may be connected to the second pads PD2, and the second signal wires SNL2 may be connected to the third pads PD3.

Each of the first sensing electrodes SE1 may include a plurality of first sensing parts SP1 arranged in a first direction DR1 and a plurality of connection patterns CP connecting the first sensing parts SP1. Each of the connection patterns CP may be located between two first sensing parts SP1 adjacent to each other in a first direction DR1 to connect the two first sensing parts SP1.

Each of the second sensing electrodes SE2 may include a plurality of second sensing parts SP2 arranged in a second direction DR2 and a plurality of extension patterns EP extending from the second sensing parts SP2. Each of the extension patterns EP may be located between two second sensing parts SP2 adjacent to each other in the second direction DR2 to extend from the two second sensing parts SP2.

The first sensing parts SP1 and the second sensing parts SP2 may have a mesh shape. The first sensing parts SP1 and the second sensing parts SP2 do not overlap each other but are spaced apart from each other, and may be alternately arranged with each other. Electrostatic capacity may be formed by the first sensing parts SP1 and the second sensing parts SP2. The extension patterns EP may not overlap the connection patterns CP.

Figure 10:
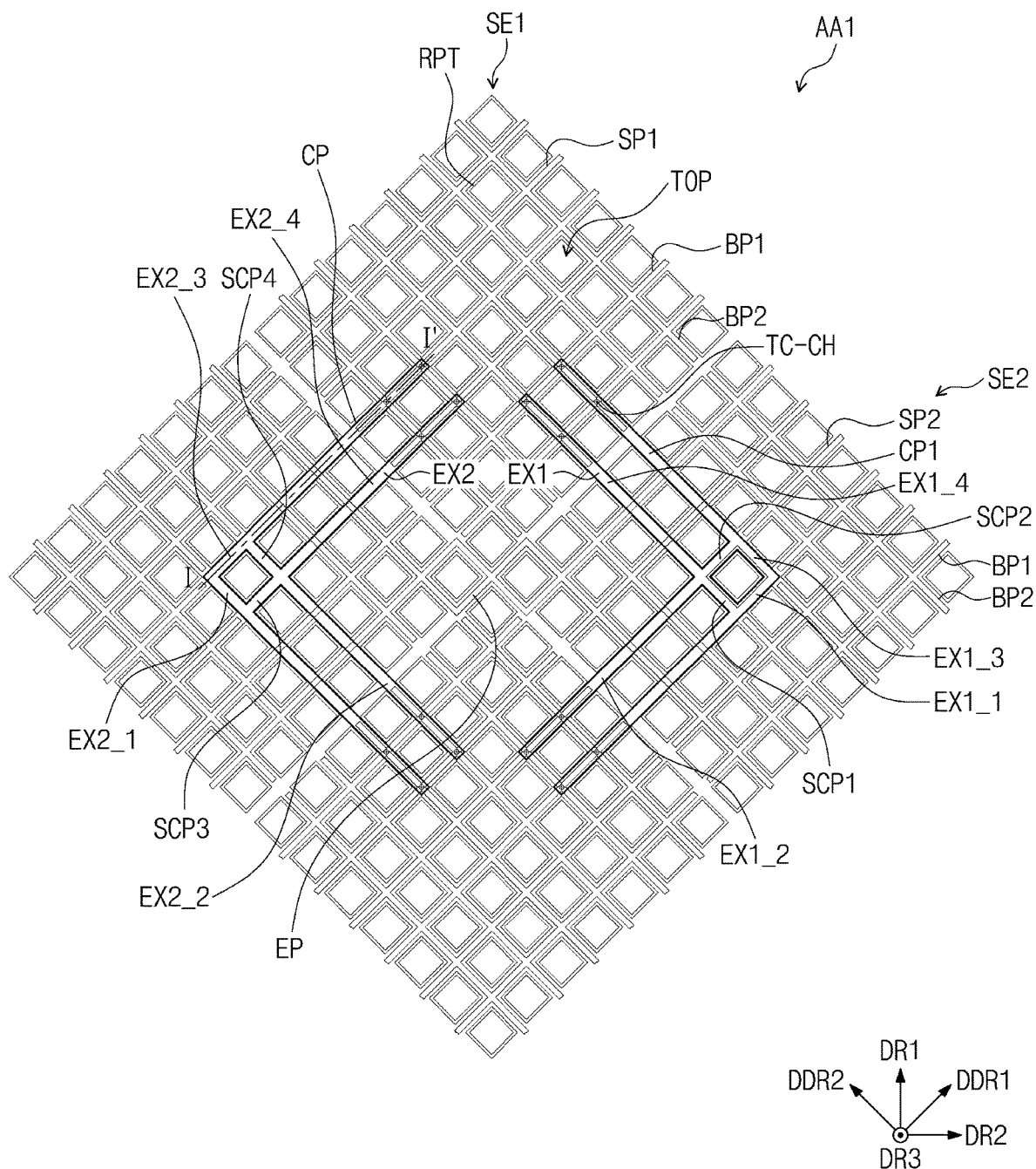
FIG. 10 is an enlarged view of the first area AA1 shown in FIG. 9 according to some example embodiments.

FIG. 10 is an enlarged view of the first area AA1 shown in FIG. 9.

Referring to FIG. 10, in order to have a mesh shape, each of the first and second sensing parts SP1 and SP2 may include a plurality of first branch parts BP1 extending in a first diagonal direction DDR1 and a plurality of second branch parts BP2 extending in a second diagonal direction DDR2.

The first diagonal direction DDR1 may be defined as a direction intersecting the first and second directions DR1 and DR2 on a plane defined by the first and second directions DR1 and DR2. The second diagonal direction DDR2 may be defined as a direction intersecting the first diagonal direction DDR1 on a plane defined by the first and second directions DR1 and DR2.

The first branch parts BP1 and the second branch parts BP2 of each of the first and second sensing parts SP1 and SP2 may cross each other and be integrally formed. Touch opening parts TOP having a rhombus shape may be defined by the first branch parts BP1 and the second branch parts BP2.

The connection pattern CP may extend so as not to overlap the extension pattern EP to connect the first sensing parts SP1. The connection pattern CP may be connected to the first sensing parts SP1 through a plurality of contact holes TC-CH. The connection pattern CP may extend toward the first sensing parts SP1 through areas overlapping the second sensing parts SP2. The connection pattern CP may be defined as a first conductive layer.

The extension pattern EP may be located between the first sensing parts SP1 and may extend from the second sensing parts SP2. The second sensing parts SP2 and the extension pattern EP may be integrally formed. The extension pattern EP may have a mesh shape. The extension pattern EP, the first sensing parts SP1, and the second sensing parts SP2 may be simultaneously patterned with the same material and formed on the same layer. The extension pattern EP, the first sensing parts SP1, and the second sensing parts SP2 are located on a layer different from the connection pattern CP, and may be defined as a second conductive layer.

The input sensing unit ISP may include a plurality of reflection patterns RPT located on the touch opening part TOP. The reflection patterns RPT may extend from the first sensing parts SP1, the second sensing parts SP2, and the extension pattern EP. The reflection patterns RPT may reflect light provided from the emission area PA. A more detailed configuration of the reflection patterns RPT will be described in detail below.

The connection pattern CP may include a first extension part EX1 and a second extension part EX2 having a shape symmetrical to the first extension part EX1. The extension pattern EP may be located between the first extension part EX1 and the second extension part EX2. The first extension part EX1 extends through an area overlapping one of the second sensing parts SP2 and may be connected to the first sensing parts SP1. The second extension part EX2 extends through an area overlapping the other second sensing part SP2 of the second sensing parts SP2 and may be connected to the first sensing parts SP1.

Hereinafter, the first sensing parts SP1 are defined as an upper first sensing part SP1 or a lower first sensing part SP1 according to a relative placement position. In addition, the second sensing parts SP2 are defined as a left second sensing part SP2 or a right second sensing part SP2 according to a relative placement position.

The portions (e.g., the set or predetermined portions) of the first and second extension parts EX1 and EX2 adjacent to one side of the first and second extension parts EX1 and EX2 may be connected to the lower first sensing part SP1 through a plurality of contact holes TC-CH. The portions (e.g., the set or predetermined portions) of the first and second extension parts EX1 and EX2 adjacent to the other sides of the first and second extension parts EX1 and EX2 may be connected to the upper first sensing part SP1 through a plurality of contact holes TC-CH.

The first extension part EX1 may include a first sub extension part EX1_1 and a second sub extension part EX1_2 extending in the first diagonal direction DDR1, a third sub extension part EX1_3 and a fourth sub extension part EX1_4 extending in the second diagonal direction DDR2, a first sub conductive pattern SCP1 extending in the second diagonal direction DDR2, and the second sub conductive pattern SCP2 extending in a first diagonal direction DDR1.

The portions (e.g., the set or predetermined portions) of the first and second sub extension parts EX1_1 and EX1_2 adjacent to one side of the first and second sub extension parts EX1_1 and EX1_2 may be connected to the lower first sensing part SP1 through a plurality of contact holes TC-CH. The portions (e.g., the set or predetermined portions) of the third and fourth sub extension parts EX1_3 and EX1_4 adjacent to one side of the third and fourth sub extension parts EX1_3 and EX1_4 may be connected to the upper first sensing part SP1 through a plurality of contact holes TC-CH.

The other side of the first sub extension part EX1_1 may extend from the other side of the third sub extension part EX1_3, and the other side of the second sub extension part EX1_2 may extend from the other side of the fourth sub extension part EX1_4. The first sub conductive pattern SCP1 may extend from the other side of the fourth sub extension part EX1_4 in a second diagonal direction DDR2 and may extend to the first sub extension part EX1_1. The second sub conductive pattern SCP2 may extend from the other side of the second sub extension part EX1_2 in a first diagonal direction DDR1 and may extend to the third sub extension part EX1_3.

The first sub extension part EX1_1, the second sub extension part EX1_2, the third sub extension part EX1_3, the fourth sub extension part EX1_4, the first sub conductive pattern SCP1, and the second sub conductive pattern SCP2 can be formed integrally.

The first and second sub extension parts EX1_1 and EX1_2 may extend to cross a number (e.g., a set or predetermined number) of second branch parts BP2 adjacent to the lower first sensing part SP1 among the second branch parts BP2 of the right second sensing part SP2. The first branch parts BP1 of the right second sensing part SP2 may not be located in some areas overlapping the first and second sub extension parts EX1_1 and EX1_2 and the second sub conductive pattern SCP2.

The third and fourth sub extension parts EX1_3 and EX1_4 may extend to cross a number (e.g., a set or predetermined number) of first branch parts BP1 adjacent to the upper first sensing part SP1 among the first branch parts BP1 of the right second sensing part SP2. The second branch parts BP2 of the right second sensing part SP2 may not be located in some areas overlapping the third and fourth sub extension parts EX1_3 and EX1_4 and the first sub conductive pattern SCP1.

The second extension part EX2 may include a fifth sub extension part EX2_1 and a sixth sub extension part EX2_2 extending in the second diagonal direction DDR2, a seventh sub extension part EX2_3 and an eighth sub extension part EX2_4 extending in the first diagonal direction DDR1, a third sub conductive pattern SCP3 extending in the first diagonal direction DDR1, and a fourth sub conductive pattern SCP4 extending in the second diagonal direction DDR2.

The left second sensing part SP2 may have a structure symmetrical with the right second sensing part SP2, and the second extension part EX2 may have a structure symmetrical with the first extension part EX1. Accordingly, the description of the fifth to eighth sub extension parts EX2_1 to EX2_4 and the third and fourth sub conductive patterns SCP3 and SCP4 will be omitted.

The input sensing unit ISP may include a plurality of reflection patterns RPT. The reflection patterns RPT may be spaced apart from the first and second branch parts BP1 and BP2 and located on the touch opening parts TOP. For example, the reflection patterns RPT may have a single closed curve shape having a rhombus shape, but the shape of the reflection patterns RPT is not limited thereto. A more detailed configuration of the reflection patterns RPT will be described in detail below.

Figure 11:
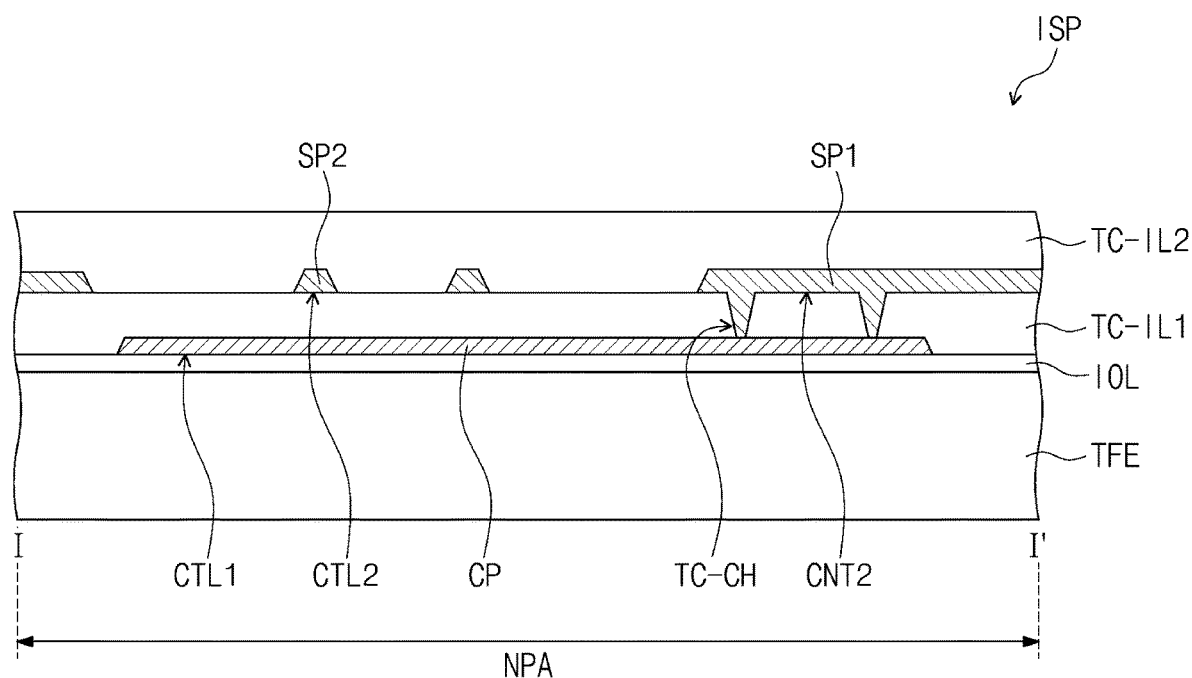
FIG. 11 is a cross-sectional view taken along the line I-I' shown in FIG. 10 according to some example embodiments.

FIG. 11 is a cross-sectional view taken along line I-I' shown in FIG. 10.

Referring to FIG. 11, an insulating layer IOL may be located on a thin film sealing layer TFE. The insulating layer IOL may be an inorganic layer. The first conductive layer CTL1 may be located on the insulating layer IOL. The first conductive layer CTL1 may include a connection pattern CP. According to some example embodiments of the inventive concept, the first conductive layer CTL1 may be directly located on the upper surface of the insulating layer IOL.

A first insulating layer TC-IL1 may be located on the first conductive layer CTL1 and the insulating layer IOL. The first insulating layer TC-IL1 may be located at the non-emission area NPA to cover the first conductive layer CTL1.

A second conductive layer CTL2 may be located on the first insulating layer TC-IL1. The second conductive layer CTL2 may include first sensing parts SP1 and second sensing parts SP2. In addition, the second conductive layer CTL2 may include an extension pattern EP integrally formed with the second sensing parts SP2.

The connection pattern CP may be connected to the first sensing parts SP1 through a plurality of contact holes TC-CH defined in the first insulating layer TC-IL1. A second insulating layer TC-IL2 may be located on the first insulating layer TC-IL1 to cover the first sensing parts SP1 and the second sensing parts SP2.

The first insulating layer TC-IL1 and the second insulating layer TC-IL2 may be organic layers including an organic material.

Figure 12:
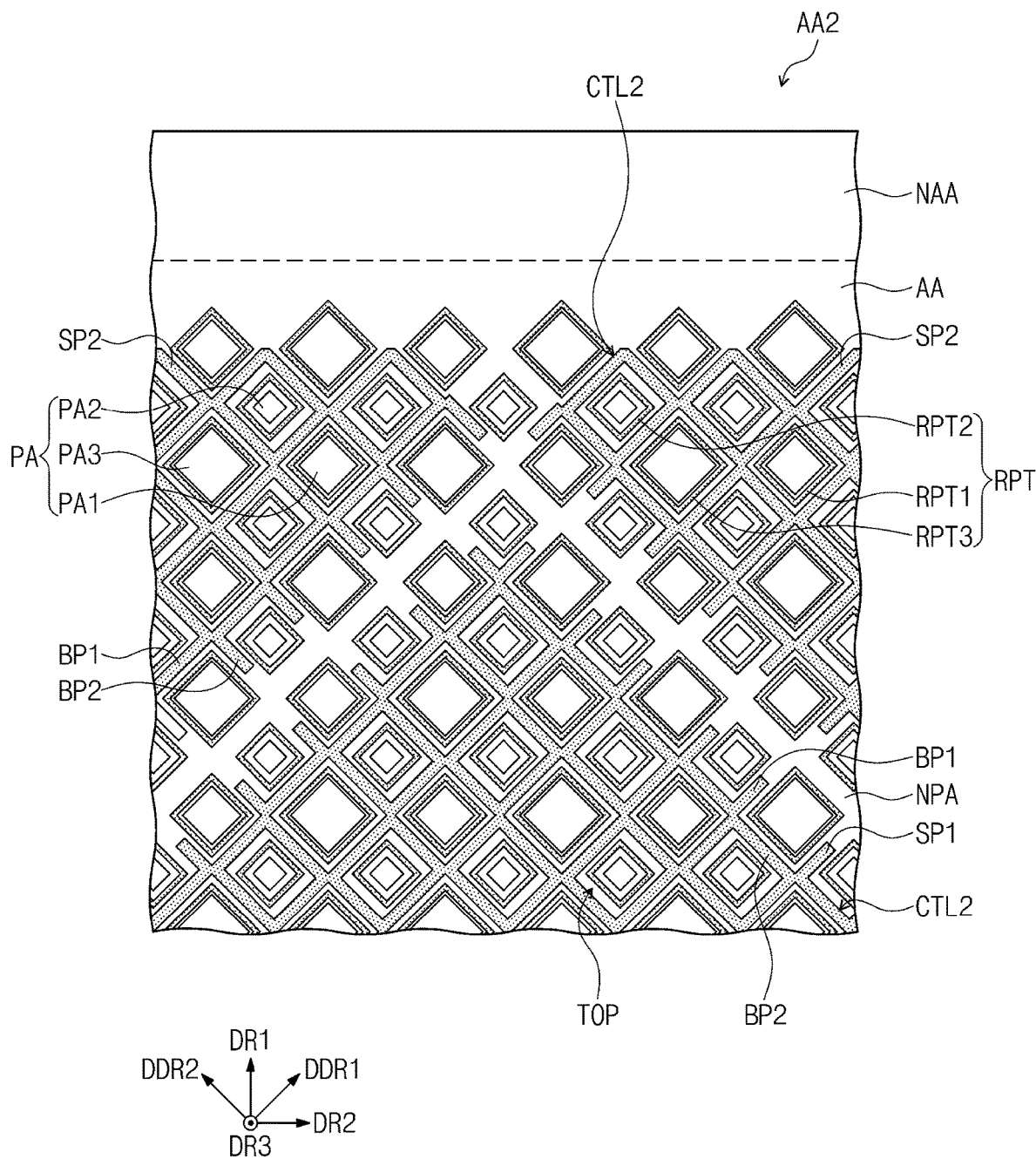
FIG. 12 is an enlarged view of the second area AA2 shown in FIG. 6 according to some example embodiments.

FIG. 12 is an enlarged view of the second area AA2 shown in FIG. 6.

For example, in FIG. 12, emission areas PA1, PA2, and PA3 are illustrated together with the first and second sensing parts SP1 and SP2.

Referring to FIG. 12, the emission areas PA may be arranged in a first diagonal direction DDR1 and a second diagonal direction DDR2. The first and second branch parts BP1 and BP2 may overlap the non-emission area NPA between the emission areas PA. That is, the first and second sensing parts SP1 and SP2 may be located on the non-emission area NPA. Because the first and second sensing parts SP1 and SP2 are located on the non-emission area NPA, light generated in the emission areas PA1, PA2, and PA3 may be normally emitted without being affected by the first and second sensing parts SP1 and SP2.

The emission areas PA may include a plurality of first emission areas PA1 displaying red, a plurality of second emission areas PA2 displaying green, and a plurality of third emission areas PA3 displaying blue. When viewed from the plane, the second emission areas PA2 have an area smaller than the first emission areas PA1, and the third emission areas PA3 may have an area larger than the first emission areas PA1.

The emission areas PA1, PA2, and PA3 may have a rhombus shape. The touch opening parts TOP may overlap the emission areas PA1, PA2, and PA3. The touch opening parts TOP may have a rhombus shape corresponding to the shape of the emission areas PA1, PA2, and PA3.

When viewed from the plane, the reflection patterns RPT may be spaced apart from the second conductive layer CTL2 including the first and second branch parts BP1 and BP2 to be located on the touch opening parts TOP. When viewed from the plane, the reflection patterns RPT may overlap the non-emission area NPA and may be adjacent to the emission areas PA. The reflection patterns RPT may be located between the emission areas PA and the second conductive layer CTL2.

The reflection patterns RPT may be located adjacent to the edges of the emission areas PA to extend along the edges of the emission areas PA. The reflection patterns RPT may surround the emission areas PA, respectively.

The reflection patterns RPT may include a plurality of first reflection patterns RPT1 adjacent to the first emission areas PA1, a plurality of second reflection patterns RPT2 adjacent to the second emission areas PA2, and a plurality of third reflection patterns RPT3 adjacent to the third emission areas PA3. The first reflection patterns RPT1 may surround the first emission areas PA1, the second reflection patterns RPT2 may surround the second emission areas PA2, and the third reflection patterns RPT3 may surround the third emission areas PA3.

Figure 13:
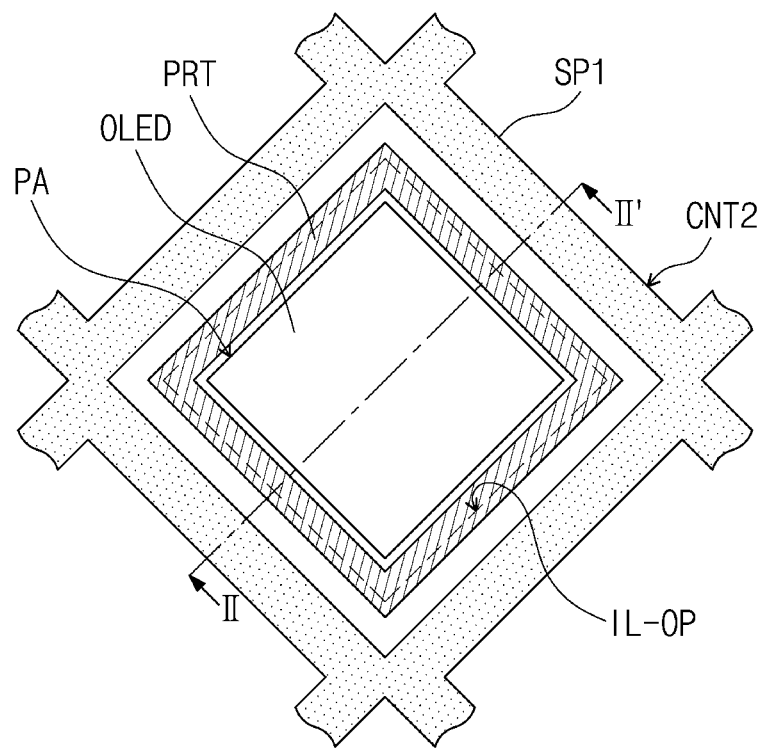
FIG. 13 is an enlarged view of an emission area and a reflection pattern around the emission area shown in FIG. 12 according to some example embodiments.
Figure 13:
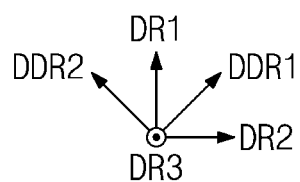
Figure 14:
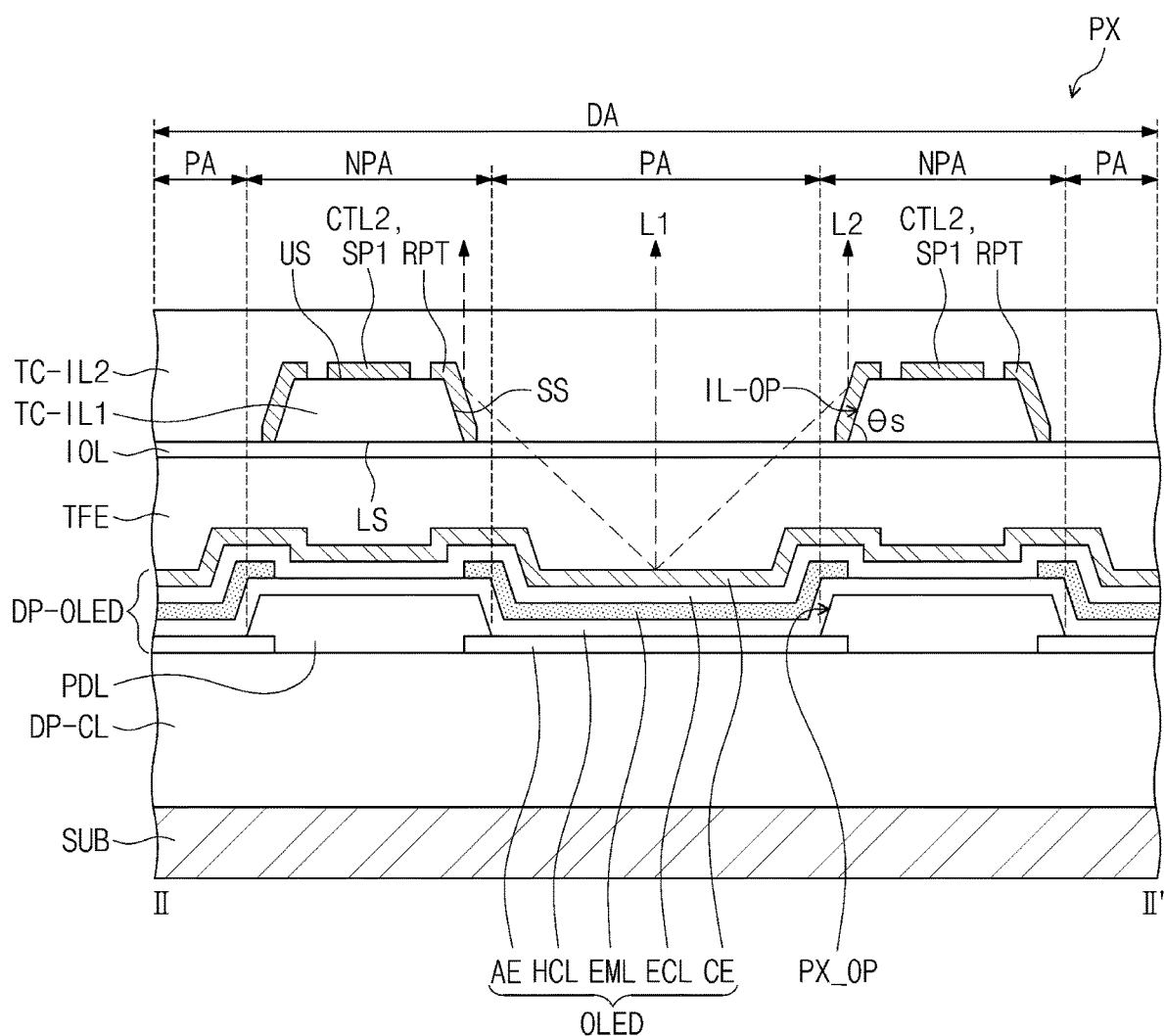
FIG. 14 is a cross-sectional view taken along the line II-II' shown in FIG. 13 according to some example embodiments.

FIG. 13 is an enlarged view of an emission area and a reflection pattern around the emission area shown in FIG. 12. FIG. 14 is a cross-sectional view taken along line II-II' shown in FIG. 13.

For example, in FIG. 14, a reflection pattern RPT located outside rather than a reflection pattern RPT surrounding one emission area PA is also illustrated. Also, the circuit element layer DP-CL is shown as a single layer. Hereinafter, in FIGS. 13 and 14, a configuration of one reflection pattern RPT surrounding one emission area PA will be described.

Referring to FIGS. 13 and 14, the display element layer DP-OLED may include an emission area PA and a non-emission area NPA around the emission area. The emission area PA shown in FIGS. 13 and 14 may be any one of the first, second, and third emission areas PA1, PA2, and PA3. An opening part IL-OP overlapping the emission area PA may be defined in the first insulating layer TC-IL1 when viewed from the plane. When viewed from the plane, the area of the opening part IL-OP may be larger than the area of the opening part PX-OP defined in the emission area PA. Accordingly, when viewed from the plane, the area of the opening part IL-OP may be larger than the area of the emission area PA and may be larger than the area of the light emitting element OLED located in the emission area PA.

The second conductive layer CTL2 and the reflection pattern RPT may be located on the first insulating layer TC-IL1. The reflection pattern RPT illustrated in FIGS. 13 and 14 may be any one of the first, second, and third reflection patterns RPT1, RPT2, and RPT3.

The first insulating layer TC-IL1 may include a flat upper surface US, a side surface SS defining an opening part IL-OP, and a flat lower surface LS located under the upper surface US. The side surface SS may connect the end of the upper surface US and the end of the lower surface LS. The lower surface LS may be defined as a surface opposite to the upper surface US.

The upper surface US and the lower surface LS may have a plane defined by the first and second directions DR1 and DR2. The side surface SS may have an inclined surface. For example, the side surface SS may have an inclination angle θs of 40° to 80° with the lower surface LS, and for example, an inclination angle θs of 70° with the lower surface LS.

The second conductive layer CTL2 may be located on the upper surface US. The reflection pattern RPT may be located on the side surface SS. The reflection pattern RPT may be formed by simultaneously patterning with the same material as the second conductive layer CTL2. This configuration will be described in detail below in a method of manufacturing a display device.

The reflection pattern RPT may be further located on a portion of the upper surface US adjacent to the side surface SS. The reflection pattern RPT may be further located on a portion of the insulating layer IOL adjacent to the first insulating layer TC-IL1. The reflection pattern RPT may not be located on the emission area PA.

The reflection pattern RPT may be spaced apart from a boundary between the emission area PA and the non-emission area NPA by a distance (e.g., a set or predetermined distance). However, embodiments according to the inventive concept are not limited thereto, and the reflection pattern RPT may be further located at a boundary between the emission area PA and the non-emission area NPA.

The second insulating layer TC-IL2 may be located on the first insulating layer TC-IL1 and the insulating layer IOL to cover the reflection pattern RPT and the second conductive layer CTL2. The second insulating layer TC-IL2 may be located on the opening part IL-OP to fill the opening part IL-OP. The reflection pattern RPT may be insulated from the second conductive layer CTL2 by the second insulating layer TC-IL2 and may be electrically separated.

The light L1 generated by the light emitting element OLED located in the emission area PA may travel in an upper direction (e.g., a third direction DR3). The light L2 generated by the light emitting element OLED may travel toward the non-emission area NPA. The light L2 may travel toward the side surface SS and may be provided to the reflection pattern RPT.

The reflection pattern RPT may reflect light L2. The reflection pattern RPT may include a metallic material that can reflect light. The light L2 may be reflected at the reflection pattern RPT and travel upwardly. Accordingly, front luminance of the display device DD may be improved.

After the reflection pattern RPT is not used and the first insulating layer TC-IL1 in which the opening part IL-OP is not defined is entirely located on the insulating layer IOL, a separate refractive pattern for reflecting light L2 may be located on the first insulating layer TC-IL1. The second insulating layer TC-IL2 may be located on a separate refractive pattern. In this case, because a separate refractive pattern is additionally utilized or formed, manufacturing process steps of the display device DD for adding a separate refractive pattern may increase. In addition, because a separate refractive pattern is added, the thickness of the display device DD may increase.

However, according to some example embodiments of the inventive concept, because a separate refractive pattern is not used, manufacturing process steps of the display device DD may be reduced, and the thickness of the display device DD may be reduced.

FIGS. 15 to 19 are diagrams for describing a method of manufacturing a display device according to some example embodiments of the inventive concept.

As an example, FIGS. 15 to 19 are illustrated in cross-sections corresponding to FIG. 14.

Figure 15:
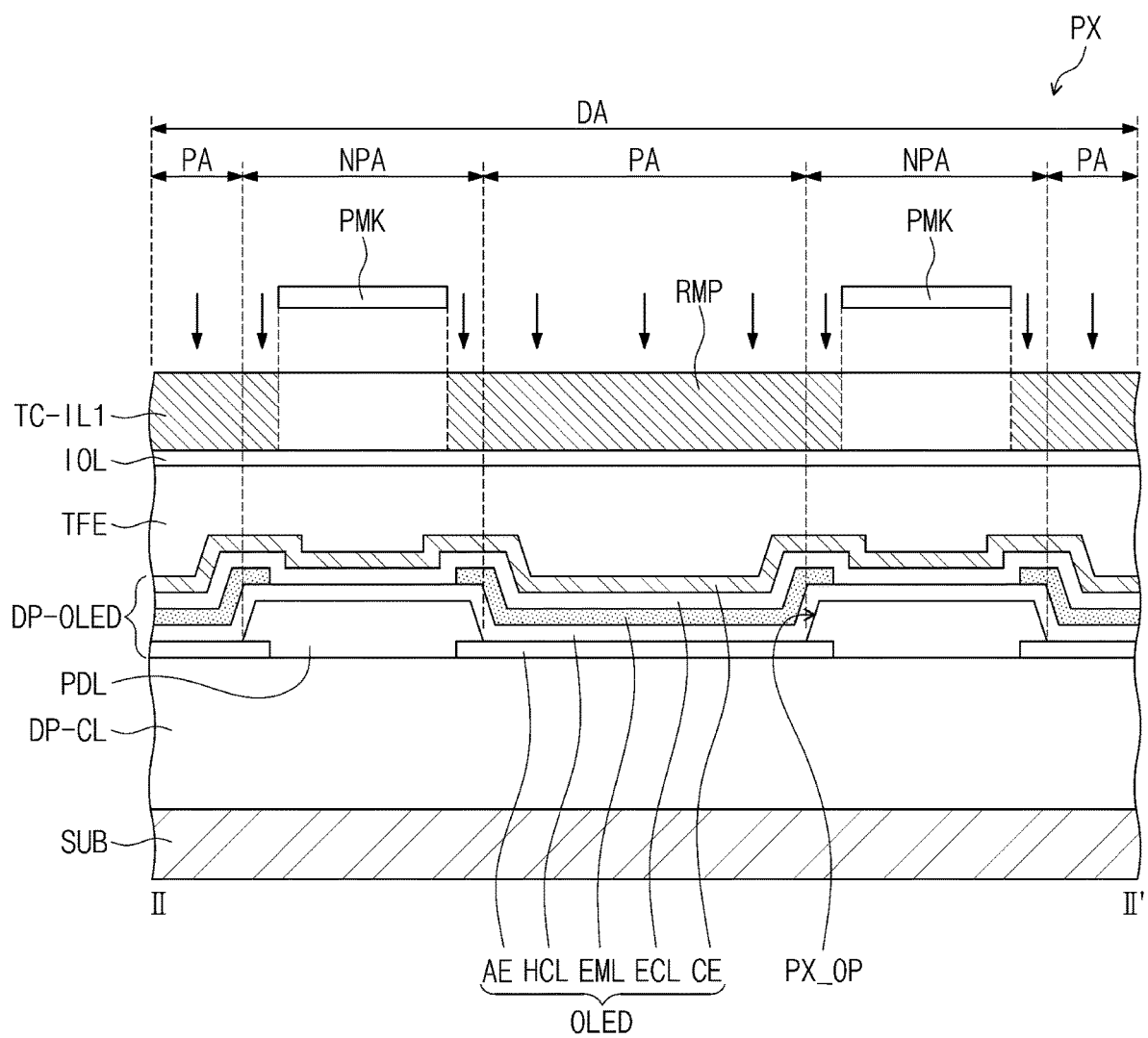
FIGS. 15 to 19 are diagrams for describing a method of manufacturing a display device according to some example embodiments of the inventive concept.

Referring to FIG. 15, a display element layer DP-OLED including an emission area PA and a non-emission area NPA is prepared, and a thin film sealing layer TFE and an insulating layer IOL may be provided on the display element layer DP-OLED.

A first insulating layer TC-IL1 may be provided on the insulating layer IOL. According to some example embodiments, the first conductive layer CTL1 shown in FIG. 11 may be provided on the insulating layer IOL in the non-emission area NPA, and the first insulating layer TC-IL1 may be provided on the insulating layer IOL to cover the first conductive layer CTL1.

When viewed from the plane, a removal portion RMP overlapping a portion of the emission area PA and the non-emission area NPA adjacent to the emission area PA may be defined in the first insulating layer TC-IL1. The photo mask PMK is located on the non-emission area NPA, and the removal portion RMP is exposed by the photo mask PMK, so that the removal portion RMP may be exposed. Substantially, the removal portion RMP may be a portion of the first insulating layer TC-IL1 overlapping the opening part IL-OP.

Figure 16:
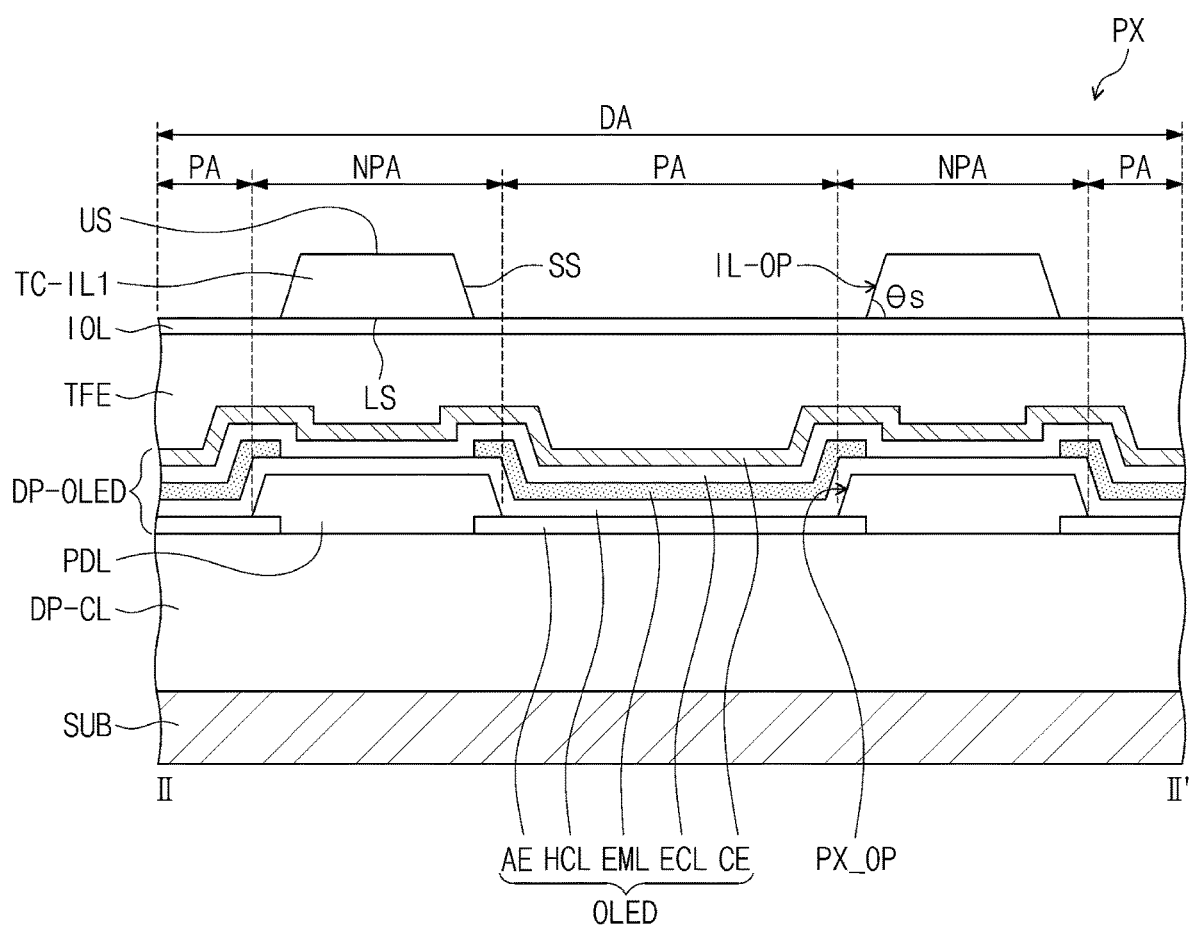

Referring to FIG. 16, the exposed removal portion RMP may be removed by a developing process. Because the removal portion RMP is removed, an opening part IL-OP may be defined in the first insulating layer TC-IL1. The removal portion RMP is removed to form an upper surface US, a lower surface LS, and a side surface SS having an inclined surface of the first insulating layer TC-IL1.

According to some example embodiments, after the removal portion RMP is removed, a temporary hardening process for the first insulating layer TC-IL1 having an opening part IL-OP may be further performed. For example, after the removal portion RMP is removed, the side surface SS may be vertical, and then, heat having a temperature (e.g., a set or predetermined temperature) may be applied to the first insulating layer TC-IL1. In this case, the side surface of the first insulating layer TC-IL1 flows down by heat, and as a result, the side surface SS may have an inclined surface forming an inclination angle θs with the lower surface LS.

Figure 17:
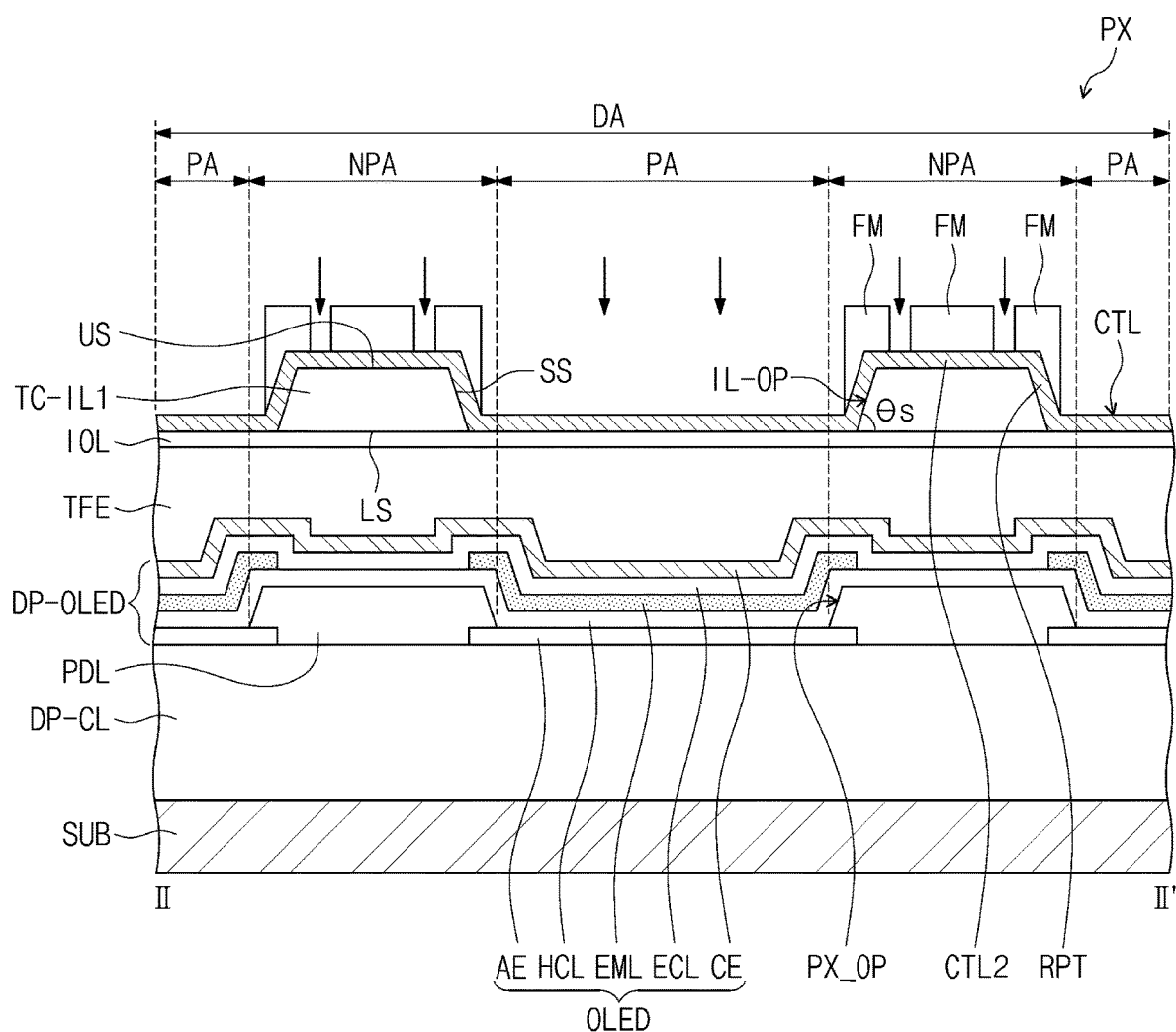

Referring to FIG. 17, a conductive layer CTL may be provided on the first insulating layer TC-IL1 and the insulating layer IOL. The conductive layer CTL includes a conductive material, and the second conductive layer CTL2 and the reflection pattern RPT may be formed by the conductive layer CTL.

Specifically, a photo mask FM may be located on a central portion of the upper surface US, a portion of the conductive layer CTL overlapping the side surface SS, a portion of the upper surface US adjacent to the side surface SS, and a portion of the insulating layer IOL adjacent to the side surface SS. According to some example embodiments, a photoresist (photosensitive resin) is located on the conductive layer CTL, and portions of the photoresist except for the portion where the second conductive layer CTL2 and the reflection pattern RPT are to be formed are removed so that a photo mask FM may be formed.

By using the photo mask FM as a mask, portions of the conductive layer CTL except for the portion where the photo mask FM is located may be removed. A portion of the conductive layer CTL except for a portion where the photo mask FM is located may be removed through a dry etching method or a wet etching method.

Figure 18:
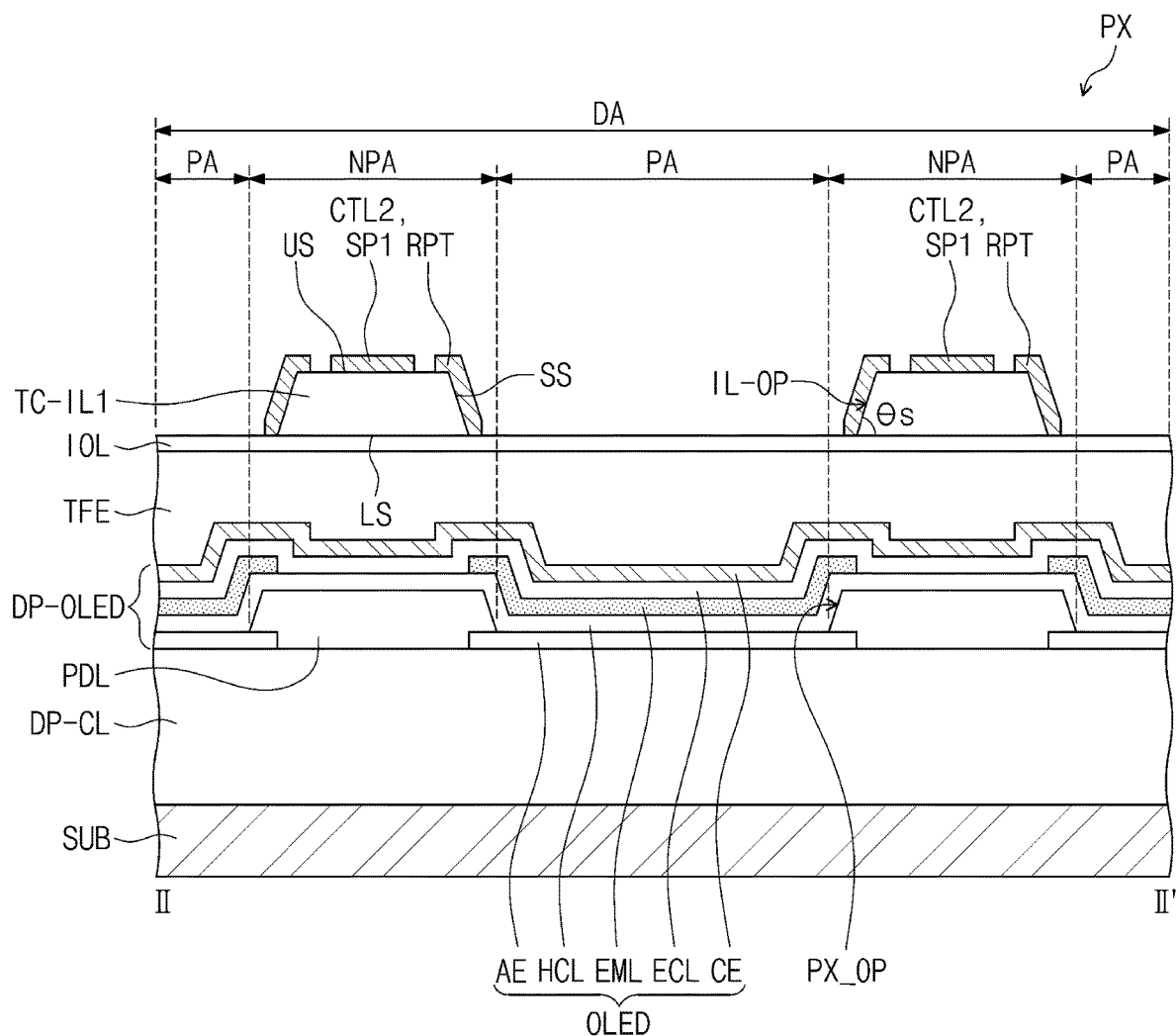

Referring to FIG. 18, a portion of the conductive layer CTL is removed so that the second conductive layer CTL2 and the reflection pattern RPT spaced apart from the second conductive layer CTL2 may be provided on the first insulating layer TC-IL1. As described above, the reflection pattern RPT may be located on the side surface SS, a portion of the upper surface US adjacent to the side surface SS, and a portion of the insulating layer IOL adjacent to the side surface SS.

Figure 19:
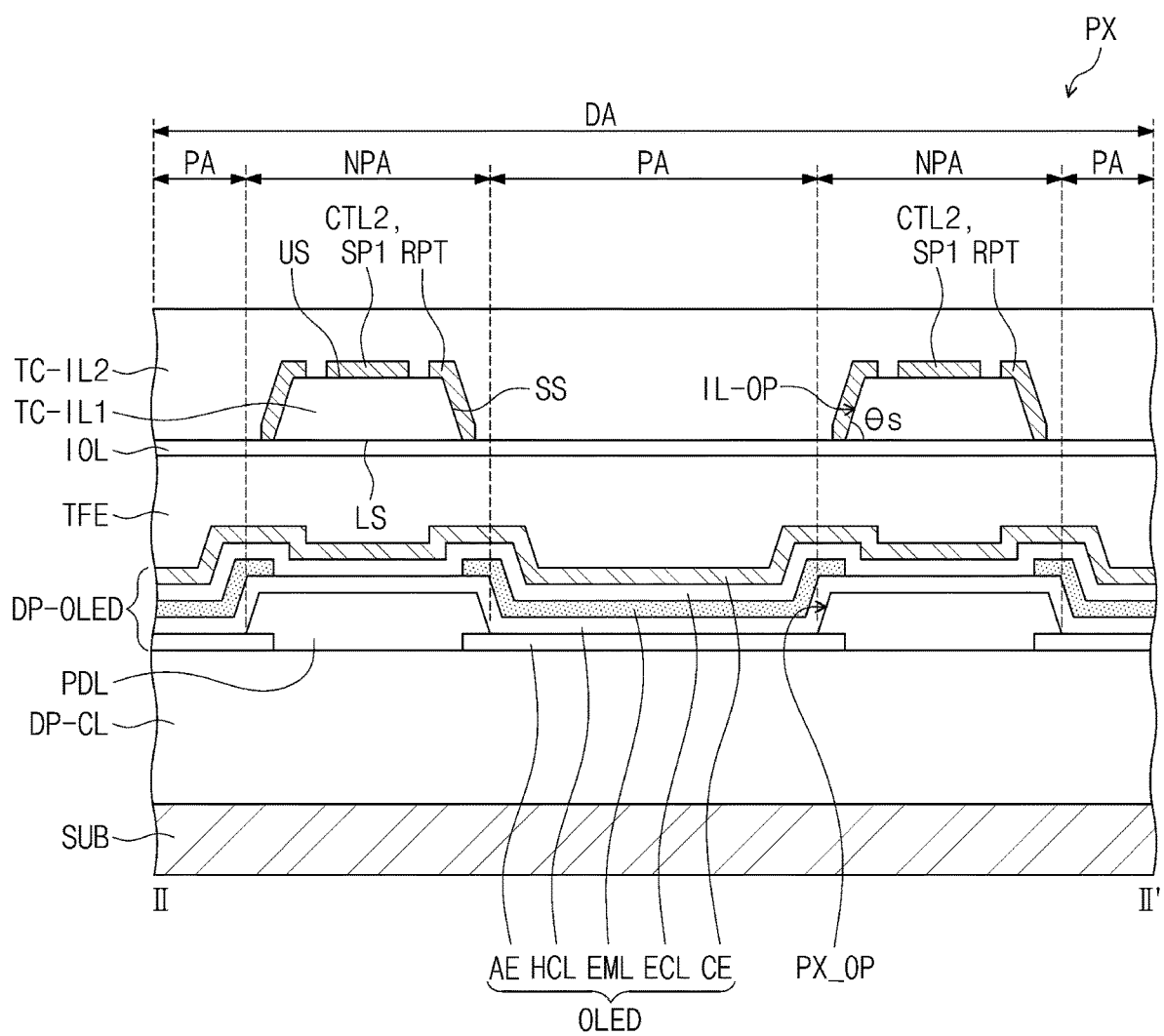

Referring to FIG. 19, a second insulating layer TC-IL2 is provided on the first insulating layer TC-IL1 and the insulating layer IOL to cover the reflection pattern RPT and the second conductive layer CTL2. The second insulating layer TC-IL2 may be provided on the insulating layer IOL to fill the opening part IL-OP. The reflection pattern RPT and the second conductive layer CTL2 may be insulated from each other by the second insulating layer TC-IL2.

According to some example embodiments of the inventive concept, because the separate refractive pattern described above is not used, manufacturing process steps of the display device DD may be reduced.

According to some example embodiments of the inventive concept, a reflection pattern capable of reflecting light is arranged between the input sensing unit and the emission area, and the reflection pattern reflects the light provided from the emission area and allows the reflected light to travel upwardly, so that front luminance of the display device may be improved.

In addition, according to some example embodiments of the inventive concept, because a separate refractive pattern for reflecting light is not used, the thickness of the display device may be reduced.

Although aspects of some example embodiments of the inventive concept have been described, it is understood that the inventive concept should not be limited to these example embodiments but various changes and modifications can be made by one ordinary skilled in the art within the spirit and scope of the inventive concept according to the following claims and their equivalents.

What is claimed is:

1. A display device comprising:
  a display element layer including an emission area and a non-emission area around the emission area, the non-emission area including a pixel defining layer in which a pixel opening part defined and the emission area including a light emitting element disposed in the pixel opening part;
  a first conductive layer on the pixel defining layer in the non-emission area;
  a first insulating layer on the pixel defining layer in the non-emission area to cover the first conductive layer, the first insulating layer having an opening part overlapping the emission area in a plan view;
  a second conductive layer directly on the first insulating layer; and
  a reflection pattern spaced apart from the second conductive layer and on opposite side surfaces of the first insulating layer, wherein the second conductive layer is on a flat upper surface of the first insulating layer between the opposite side surfaces of the first insulating layer in a plan view, and wherein the reflection pattern and the second conductive layer overlap the non-emission area and do not overlap the emission area when viewed on a plan, are coplanar, and separated from each other on the flat upper surface of the first insulating layer.

2. The display device of claim 1, wherein the first insulating layer comprises an organic material.

3. The display device of claim 1, wherein the reflection pattern is insulated from the second conductive layer.

4. The display device of claim 1, further comprising a second insulating layer on the first insulating layer to cover the reflection pattern and the second conductive layer, wherein the second insulating layer fills the opening part.

5. The display device of claim 4, wherein the second insulating layer comprises an organic material.

6. The display device of claim 1, wherein the first insulating layer comprises:
    an upper surface;
    a lower surface under the upper surface; and
    a side surface that connects an end of the upper surface and an end of the lower surface, and defines the opening part,
    wherein the second conductive layer is on the upper surface, and the reflection pattern is on the side surface.

7. The display device of claim 6, wherein the side surface has an inclined surface.

8. The display device of claim 7, wherein the side surface forms an inclination angle of 40 degrees to 80 degrees with the lower surface.

9. The display device of claim 6, wherein the reflection pattern is further on a portion of the upper surface adjacent to the side surface.

10. The display device of claim 6, wherein among a light generated in the emission area, a light directed toward the side surface is reflected at the reflection pattern and proceeds upward.

11. The display device of claim 6, further comprising:
    a thin film sealing layer on the display element layer; and
    an insulating layer on the thin film sealing layer,
    wherein the first conductive layer is directly on the insulating layer.

12. The display device of claim 11, wherein the reflection pattern is further on a portion of the insulating layer adjacent to the side surface.

13. The display device of claim 1, wherein the reflection pattern surrounds the emission area in the plan view.

14. The display device of claim 1, wherein an area of the opening part is larger than an area of the emission area in the plan view.

15. A display device comprising:
    a display element layer including an emission area and a non-emission area around the emission area, the non-emission area including a pixel defining layer in which a pixel opening part defined and the emission area including a light emitting element disposed in the pixel opening part;
    a thin film sealing layer on the display element layer;
    an insulating layer on the thin film sealing layer;
    a first insulating layer on the pixel defining layer in the non-emission area and directly on the insulating layer and in which an opening part overlapping the emission area is defined;
    a second conductive layer directly on the first insulating layer; and
    a reflection pattern on opposite side surfaces of the first insulating layer with an opening through the reflection pattern at a flat upper surface of the first insulating layer between the opposite side surfaces of the first insulating layer in a plan view, and
    wherein the reflection pattern and the second conductive layer overlap the non-emission area and do not overlap the emission area when viewed on a plan, are coplanar, and separated from each other on the flat upper surface of the first insulating layer.

16. The display device of claim 15, wherein a side surface from among the opposite side surfaces has an inclined surface.

17. The display device of claim 15, wherein the reflection pattern surrounds the emission area in a plan view.

18. The display device of claim 15, further comprising a first conductive layer directly on the insulating layer,
    wherein the first insulating layer is directly on the insulating layer to cover the first conductive layer.

19. The display device of claim 15, further comprising a second insulating layer on the first insulating layer to cover the reflection pattern and the second conductive layer, wherein the second insulating layer fills the opening part.

* * * * *